(12) United States Patent
Guo

(10) Patent No.: US 8,941,126 B2
(45) Date of Patent: Jan. 27, 2015

(54) SEMICONDUCTOR ELECTRICITY CONVERTER

(71) Applicant: Lei Guo, Beijing (CN)

(72) Inventor: Lei Guo, Beijing (CN)

( * ) Notice: Subject to any disclaimer, the term of this patent is extended or adjusted under 35 U.S.C. 154(b) by 0 days.

(21) Appl. No.: 13/823,481

(22) PCT Filed: Nov. 9, 2012

(86) PCT No.: PCT/CN2012/084413
§ 371 (c)(1),
(2) Date: Mar. 14, 2013

(87) PCT Pub. No.: WO2013/067967
PCT Pub. Date: May 16, 2013

(65) Prior Publication Data
US 2014/0061679 A1    Mar. 6, 2014

(30) Foreign Application Priority Data

| Nov. 10, 2011 | (CN) | ........................... 2011 1 0356005 |
| Jan. 20, 2012 | (CN) | ........................... 2012 1 0020018 |
| Sep. 5, 2012 | (CN) | ........................... 2012 1 0326608 |
| Sep. 5, 2012 | (CN) | ........................... 2012 1 0326663 |
| Oct. 17, 2012 | (CN) | ........................... 2012 1 0395009 |

(51) Int. Cl.
*H01L 31/12* (2006.01)
*H01L 31/173* (2006.01)
*H02M 11/00* (2006.01)

(52) U.S. Cl.
CPC ............ *H02M 11/00* (2013.01); *H01L 31/173* (2013.01)
USPC ......................................................... 257/84

(58) Field of Classification Search
CPC ....................................................... H04B 10/00
USPC ......... 257/84, 80, 431, 40; 363/123; 136/253; 250/213
See application file for complete search history.

(56) References Cited

U.S. PATENT DOCUMENTS 3,790,867 A    2/1974   Hayakawa
5,009,719 A    4/1991   Yoshida
(Continued)

FOREIGN PATENT DOCUMENTS

CN       1993836 A     7/2007
CN     101257055 A     9/2008
(Continued)

OTHER PUBLICATIONS

International Search Report and Written Opinion dated Feb. 28, 2013 for corresponding International Application No. PCT/CN2012/084413, filed Nov. 9, 2012.

*Primary Examiner* — Nathan Ha
(74) *Attorney, Agent, or Firm* — David D. Brush; Westman, Champlin & Koehler, P.A.

(57) ABSTRACT

A semiconductor electricity converter is provided. The semiconductor electricity converter includes: an AC input module, for converting an input AC electric energy into a light energy, the AC input module including a plurality of semiconductor electricity-to-light conversion structures, each semiconductor electricity-to-light conversion structure including an electricity-to-light conversion layer; and an AC output module, for converting the light energy into an output AC electric energy, the AC output module including a plurality of semiconductor light-to-electricity conversion structures, each semiconductor light-to-electricity conversion structure including a light-to-electricity conversion layer; in which an emitting spectrum of each semiconductor electricity-to-light conversion structure and an absorption spectrum of each semiconductor light-to-electricity conversion structure are matched with each other.

36 Claims, 11 Drawing Sheets

(56) References Cited

U.S. PATENT DOCUMENTS

| | | |
|---|---|---|
| 5,935,727 A | 8/1999 | Chiao |
| 5,981,931 A * | 11/1999 | Kinno et al. ............... 250/208.1 |
| 6,121,541 A | 9/2000 | Arya |
| 6,278,055 B1 | 8/2001 | Forrest et al. |
| 7,180,098 B2 | 2/2007 | Speyer et al. |
| 7,346,089 B2 | 3/2008 | Ueki et al. |
| 7,964,925 B2 | 6/2011 | Fattal et al. |
| 8,030,224 B2 | 10/2011 | Taniguchi et al. |
| 8,129,611 B2 | 3/2012 | Kobayashi et al. |
| 8,208,818 B2 * | 6/2012 | Sasai ............................ 398/185 |
| 2003/0025076 A1 * | 2/2003 | Takagi et al. ................. 250/311 |
| 2003/0122228 A1 | 7/2003 | Nagase et al. |
| 2004/0246032 A1 * | 12/2004 | Ogiso et al. .................. 327/141 |
| 2006/0285566 A1 | 12/2006 | Ueki |
| 2007/0120045 A1 | 5/2007 | Yokoyama |
| 2008/0224132 A1 | 9/2008 | Forrest et al. |
| 2009/0168410 A1 | 7/2009 | Tanamura et al. |
| 2009/0206257 A1 | 8/2009 | Gunji et al. |
| 2009/0208091 A1 * | 8/2009 | Hayakawa et al. ........... 382/149 |
| 2009/0208221 A1 * | 8/2009 | Sasai ............................ 398/130 |
| 2010/0229912 A1 | 9/2010 | Eo et al. |
| 2011/0108856 A1 | 5/2011 | Wu et al. |
| 2011/0126889 A1 * | 6/2011 | Bourke et al. ................ 136/253 |
| 2011/0174358 A1 * | 7/2011 | Shin et al. .................... 136/246 |
| 2011/0174366 A1 | 7/2011 | Frolov et al. |
| 2011/0233701 A1 * | 9/2011 | Mitsui et al. ................. 257/431 |
| 2011/0315877 A1 | 12/2011 | Isozaki et al. |
| 2012/0249864 A1 * | 10/2012 | Robinson et al. ............. 348/371 |
| 2013/0049927 A1 * | 2/2013 | Ichimori ....................... 340/4.3 |
| 2013/0181208 A1 | 7/2013 | Guo |

FOREIGN PATENT DOCUMENTS

| | | |
|---|---|---|
| CN | 102005978 A | 4/2011 |
| CN | 201893715 U | 7/2011 |
| CN | 201893718 U | 7/2011 |
| CN | 102427094 A | 4/2012 |
| CN | 102496649 A | 6/2012 |
| CN | 102569488 A | 7/2012 |
| CN | 102569489 A | 7/2012 |
| CN | 202503017 U | 10/2012 |
| CN | 202523745 U | 11/2012 |
| CN | 102832288 A | 12/2012 |
| JP | H01311841 A | 12/1989 |
| JP | 2007294630 A | 11/2007 |

* cited by examiner

SEMICONDUCTOR ELECTRICITY CONVERTER

CROSS-REFERENCE TO RELATED APPLICATIONS

This Application is a Section 371 National Stage Application of International Application No. PCT/CN2012/084413, filed Nov. 9, 2012, which is incorporated by reference in its entirety and has not yet been published.

This application claims priority to and benefits of the following applications:

1) Chinese Patent Application Serial No. 201110356005.4, filed with the State Intellectual Property Office of P. R. China on Nov. 10, 2011;

2) Chinese Patent Application Serial No. 201210326663.3, filed with the State Intellectual Property Office of P. R. China on Sep. 5, 2012;

3) Chinese Patent Application Serial No. 201210395009.8, filed with the State Intellectual Property Office of P. R. China on Oct. 17, 2012;

4) Chinese Patent Application Serial No. 201210020018.9, filed with the State Intellectual Property Office of P. R. China on Jan. 20, 2012; and 5) Chinese Patent Application Serial No. 201210326608.4, filed with the State Intellectual Property Office of P. R. China on Sep. 5, 2012.

The entire contents of the above applications are incorporated herein by reference.

FIELD

The present disclosure relates to a current and voltage conversion field, and more particularly to a semiconductor electricity converter.

BACKGROUND

In an electrical and electronic system, a current conversion and a voltage conversion are common and important technologies. In prior arts (including "AC-AC voltage conversion", "DC-DC conversion", "AC-DC conversion" and "DC-AC conversion", in which AC means alternating current and DC means direct current), the current conversion and the voltage conversion need to be performed separately rather than simultaneously, which will be described in detail as follows.

In the AC-AC voltage conversion, a voltage conversion is realized by a transformer, and an energy transmission and the voltage conversion are mostly realized by an electromagnetic coupling between a primary coil and a secondary coil. An AC-AC voltage transformer has disadvantages of large volume, heavy weight and low energy density. Moreover, the AC-AC voltage transformer has a specific requirement on a frequency of an AC electricity. In one aspect, the lower the frequency is, the larger the volume and the lower an efficiency will be, and thus the voltage transformer can not be realized under an low frequency AC current; in another aspect, a large electromagnetic loss may be led at an high frequency, and thus the frequency of the AC electricity has to be constrained in a narrow range.

The DC-DC conversion can not be realized by a conversional technology. Recently, it has been found that a DC-DC voltage transformer may be realized by using a power semiconductor device as a switch, a large inductor or capacitor as an energy storage element, and under a control of a driving circuit. However, such method has disadvantages of complicated apparatus, a passive element of large volume and heavy weight, high cost, serious electromagnetic interference and an associated electromagnetic compatibility problem.

In the AC-DC current and voltage conversion, first an AC-AC voltage conversion and then an AC-DC current conversion are realized. The AC voltage conversion is realized by an independent AC transformer, while the current conversion is mostly realized by a bridge rectifier comprising a plurality of diodes. However, the bridge rectifier can only realize the current conversion.

In the DC-AC current and voltage conversion, first a DC-AC current conversion and then an AC-AC voltage conversion are realized. The voltage conversion is realized by an AC transformer, while the current conversion is mostly realized by using the power semiconductor device as the switch and combining a filter which also can only realize the current conversion.

SUMMARY

The present disclosure is aimed to solve at least one of the problems. Accordingly, a semiconductor electricity converter is provided with simple structure, small volume, safe and reliable performance.

According to a first aspect of the present disclosure, a semiconductor electricity converter is provided. The semiconductor electricity converter comprises: an AC input module, for converting an input AC electric energy into a light energy, the AC input module comprising a plurality of semiconductor electricity-to-light conversion structures, each semiconductor electricity-to-light conversion structure comprising an electricity-to-light conversion layer; and an AC output module, for converting the light energy back into an output AC electric energy, the AC output module comprising a plurality of semiconductor light-to-electricity conversion structures, each semiconductor light-to-electricity conversion structure comprising a light-to-electricity conversion layer; in which an emitting spectrum of each semiconductor electricity-to-light conversion structure and an absorption spectrum of each semiconductor light-to-electricity conversion structure are matched with each other.

In one embodiment, the AC input module comprises: a first input branch, working in a positive half cycle of an input AC current, the first input branch comprising $M_1$ semiconductor electricity-to-light conversion structures connected in series, where $M_1$ is a positive integer; and a second input branch, connected with the first input branch in parallel and working in a negative half cycle of the input AC current, the second input branch comprising $M_2$ semiconductor electricity-to-light conversion structures connected in series, where $M_2$ is a positive integer.

In one embodiment, the AC output module comprises: a first output branch, a light transmission path formed between the first output branch and the first input branch, the first output branch comprising $N_1$ semiconductor light-to-electricity conversion structures connected in series, where $N_1$ is a positive integer; and a second output branch, connected with the first output branch in parallel, polarities of the first output branch and the second output branch being opposite, a light transmission path being formed between the second output branch and the second input branch, the second output branch comprising $N_2$ semiconductor light-to-electricity conversion structures connected in series, where $N_2$ is a positive integer.

In one embodiment, the semiconductor electricity converter may further comprise: an isolation layer, the plurality of semiconductor electricity-to-light conversion structures located at one side of the isolation layer, the plurality of semiconductor light-to-electricity conversion structures located at the other side of the isolation layer; or a substrate layer, the plurality of semiconductor electricity-to-light conversion structures and the plurality of semiconductor light-to-electricity conversion structures located at a same side of the substrate layer, the substrate layer having a reflecting structure for reflecting a light emitted by each semiconductor electricity-to-light conversion structure onto one or more semiconductor light-to-electricity conversion structures of the plurality of semiconductor light-to-electricity conversion structures.

According to a second aspect of the present disclosure, a semiconductor electricity converter is provided. The semiconductor electricity converter comprises: an AC input module, for converting an input AC electric energy into a light energy, the AC input module comprising a plurality of semiconductor electricity-to-light conversion structures, each semiconductor electricity-to-light conversion structure comprising an electricity-to-light conversion layer; and a DC output module, for converting the light energy into an output DC electric energy, the DC output module comprising one or more semiconductor light-to-electricity conversion structures, each semiconductor light-to-electricity conversion structure comprising a light-to-electricity conversion layer; in which an emitting spectrum of each semiconductor electricity-to-light conversion structure and an absorption spectrum of each semiconductor light-to-electricity conversion structure are matched with each other.

In one embodiment, the AC input module comprises: a first input branch, working in a positive half cycle of an input AC current, the first input branch comprising $M_1$ semiconductor electricity-to-light conversion structures connected in series, where $M_1$ is a positive integer; and a second input branch, connected with the first input branch in parallel and working in a negative half cycle of the input AC current, the second input branch comprising $M_2$ semiconductor electricity-to-light conversion structures connected in series, where $M_2$ is a positive integer.

In one embodiment, the DC output module comprises: a first output branch, a light transmission path formed between the first output branch and the first input branch, the first output branch comprising $N_1$ semiconductor light-to-electricity conversion structures connected in series, where $N_1$ is a positive integer; and a second output branch, connected with the first output branch in parallel, polarities of the first output branch and the second output branch being same, a light transmission path being formed between the second output branch and the second input branch, the second output branch comprising $N_2$ semiconductor light-to-electricity conversion structures connected in series, where $N_2$ is a positive integer.

In one embodiment, the semiconductor electricity converter may further comprise: an isolation layer, the plurality of semiconductor electricity-to-light conversion structures located at one side of the isolation layer, the one or more semiconductor light-to-electricity conversion structures located at the other side of the isolation layer; or a substrate layer, the plurality of semiconductor electricity-to-light conversion structures and the one or more semiconductor light-to-electricity conversion structures located at a same side of the substrate layer, the substrate layer having a reflecting structure for reflecting a light emitted by each semiconductor electricity-to-light conversion structure onto a part or all of the one or more semiconductor light-to-electricity conversion structures.

According to a third aspect of the present disclosure, a semiconductor electricity converter is provided. The semiconductor electricity converter comprises: a DC input module, for converting an input DC electric energy into a light energy, the DC input module comprising a plurality of semiconductor electricity-to-light conversion structures, each semiconductor electricity-to-light conversion structure comprising an electricity-to-light conversion layer; and an AC output module, for converting the light energy into an output AC electric energy the AC output module comprising a plurality of semiconductor light-to-electricity conversion structures, each semiconductor light-to-electricity conversion structure comprising a light-to-electricity conversion layer; in which an emitting spectrum of each semiconductor electricity-to-light conversion structure and an absorption spectrum of each semiconductor light-to-electricity conversion structure are matched with each other.

In one embodiment, the DC input module comprises: a first input branch, comprising $M_1$ semiconductor electricity-to-light conversion structures connected in series and a first control switch, the first control switch switching the first input branch on in a positive half cycle of an output AC current, where $M_1$ is a positive integer; and a second input branch, connected with the first input branch in parallel and comprising $M_2$ semiconductor electricity-to-light conversion structures connected in series and a second control switch, the second control switch switching the second input branch on in a negative half cycle of the output AC current, where $M_2$ is a positive integer.

In one embodiment, the AC output module comprises: a first output branch, a light transmission path formed between the first output branch and the first input branch, the first output branch comprising $N_1$ semiconductor light-to-electricity conversion structures connected in series, where $N_1$ is a positive integer; and a second output branch, connected with the first output branch in parallel, polarities of the first output branch and the second output branch being opposite, a light transmission path being formed between the second output branch and the second input branch, the second output branch comprising $N_2$ semiconductor light-to-electricity conversion structures connected in series, where $N_2$ is a positive integer.

In one embodiment, the semiconductor electricity converter may further comprise: an isolation layer, the plurality of semiconductor electricity-to-light conversion structures located at one side of the isolation layer, the plurality of semiconductor light-to-electricity conversion structures located at the other side of the isolation layer; or a substrate layer, the plurality of semiconductor electricity-to-light conversion structures and the plurality of semiconductor light-to-electricity conversion structures located at a same side of the substrate layer, the substrate layer having a reflecting structure for reflecting a light emitted by each semiconductor electricity-to-light conversion structure onto one or more semiconductor light-to-electricity conversion structures of the plurality of the semiconductor light-to-electricity conversion structures.

According to a fourth aspect of the present disclosure, a semiconductor electricity converter is provided. The semiconductor electricity converter comprises: a DC input module, for converting an input DC electric energy into a light energy the DC input module comprising one or more semiconductor electricity-to-light conversion structures, each semiconductor electricity-to-light conversion structure comprising an electricity-to-light conversion layer; and a DC output module, for converting the light energy back into an output DC electric energy, the DC output module comprising one or more semiconductor light-to-electricity conversion structures, each semiconductor light-to-electricity conversion structure comprising a light-to-electricity conversion layer; in which an emitting spectrum of each semiconductor electricity-to-light conversion structure and an absorption spectrum of each semiconductor light-to-electricity conversion structure are matched with each other.

In one embodiment, the semiconductor electricity converter may further comprise: an isolation layer, the one or more semiconductor electricity-to-light conversion structures located at one side of the isolation layer, the one or more semiconductor light-to-electricity conversion structures located at the other side of the isolation layer; or a substrate layer, the one or more semiconductor electricity-to-light conversion structures and the one or more semiconductor light-to-electricity conversion structures located at a same side of the substrate layer, the substrate layer having a reflecting structure for reflecting a light emitted by each semiconductor electricity-to-light conversion structure onto a part or all of the one or more semiconductor light-to-electricity conversion structures.

For the above four semiconductor electricity converters, additional features are described in following embodiments.

In one embodiment, each semiconductor electricity-to-light conversion structure comprises: a light emitting diode (LED), a resonant cavity light emitting diode (RC-LED), a laser diode (LD), a quantum dot light emitting device and an organic light emitting device.

In one embodiment, each semiconductor light-to-electricity conversion structure comprises: a semiconductor photovoltaic device, a quantum dot photovoltaic device and an organic material photovoltaic device.

In one embodiment, a material of the electricity-to-light conversion layer comprises any one of AlGaInP, GaN, InGaN, InGaN, AlGaInN, ZnO, AlGaInAs, GaAs, InGaAs, InGaAsP, AlGaAs, AlGaInSb, InGaAsNSb, other groups III-V and II-VI semiconductor materials and a combination thereof, organic light emitting materials and quantum dot light emitting materials.

In one embodiment, a material of the light-to-electricity conversion layer comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials.

In one embodiment, a material of the isolation layer or the substrate layer is an insulation material, comprising any one of $Al_2O_3$, AlN, $SiO_2$, MgO, $Si_3N_4$, BN, diamond, $LiAlO_2$, $LiGaO_2$, GaAs, SiC, $TiO_2$, $ZrO_2$, $SrTiO_3$, $Ga_2O_3$, ZnS, SiC, $MgAl_2O_4$, $LiNbO_3$, $LiTaO_3$, yttrium aluminitum garnet (YAG) crystal, $KNbO_3$, LiF, $MgF_2$, $BaF_2$, $GaF_2$, $LaF_3$, BeO, GaP, GaN and a combination thereof; or any one of a rare earth oxide and a combination of different rare earth oxides. In this case, an isolation between each semiconductor electricity-to-light conversion structures and each semiconductor light-to-electricity conversion structures is realized by an insulation characteristic of the isolation layer or the substrate layer.

In one embodiment, a material of the isolation layer or the substrate layer is a semiconductor material, comprising any one of GaP, GaAs, InP, GaN, Si, Ge, GaSb, other semiconductor material transparent to the light, and a combination thereof. In this case, an isolation between each semiconductor electricity-to-light conversion structure and the isolation layer and/or an isolation between each semiconductor light-to-electricity conversion structure and the isolation layer is realized by a reverse biased PN junction structure; or an isolation between each semiconductor electricity-to-light conversion structure and the substrate layer and/or an isolation between each semiconductor light-to-electricity conversion structure and the substrate layer is realized by a reverse biased PN junction structure.

In one embodiment, the semiconductor electricity converter may further comprise: a light trap for trapping a light inside of the semiconductor electricity converter to prevent an energy loss caused by a light leakage.

In one embodiment, a refractive index of a material of each layer in a light transmission path is matched with each other.

With the semiconductor electricity converter according to an embodiment of the present disclosure, a current conversion and a voltage conversion can be realized simultaneously. More specifically, when the semiconductor electricity converter is applied to an AC-AC voltage conversion, for one aspect, a current with a frequency ranging from a low frequency current to a high frequency may be processed without much energy loss, for another aspect, a square wave, a zigzag wave, a sinusoidal wave, and various modulating signals, etc., may be processed without distortion. When the semiconductor electricity converter is applied to a DC-DC voltage conversion, a DC voltage conversion may be realized directly. When the semiconductor electricity converter is applied to an AC-DC and a DC-AC voltage conversion, the current conversion and the voltage conversion may be realized simultaneously. In addition, the semiconductor electricity converter further has advantages of small volume, light weight, simple structure, safety and reliability, long lifetime, convenient installation and maintenance, etc.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1A:
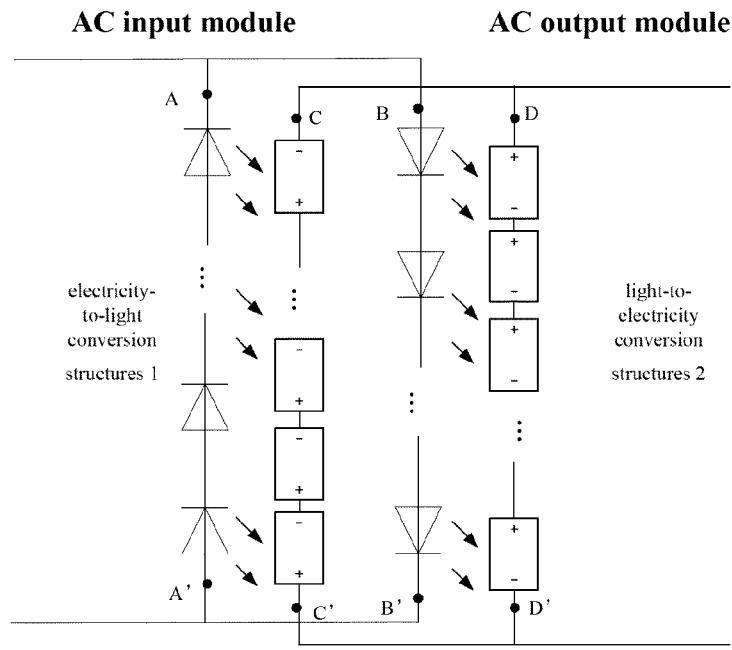
FIG. 1a is a schematic working principle diagram of a semiconductor electricity converter according to a first embodiment of the present disclosure.

Embodiments of the present disclosure will be described in detail in the following descriptions, examples of which are shown in the accompanying drawings, in which the same or similar units and units having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

In order to make those skilled in the art better understand the present disclosure, principles of the prior art and the present disclosure are illustrated herein. A conventional AC transformer follows an electromagnetic theory, while the semiconductor electricity converter follows a quantum theory. Photons emitted by bound electron transitions between the energy bands in semiconductors are the energy transmission media, instead of an electromagnetic field generated by free electrons oscillating in conductors. A particle behavior must therefore be considered, rather than a wave behavior, in an analysis of a fundamental working principle of this semiconductor electricity converter. In the semiconductor electricity converter, an individual photon energy corresponds to the device characteristic voltage, while a number of photons corresponds to a current flowing through a device.

The semiconductor electricity converter efficiency is determined by the electricity-to-light conversion efficiency, the light-to-electricity conversion efficiency, and the light losses. The electricity-to-light conversion efficiency and light-to-electricity conversion efficiency have already reached very high levels in current light-emitting and photovoltaic devices. With the development of high quality materials and advanced device structures, the internal quantum efficiencies (IQE), which indicate the conversion efficiencies between photons (light) and electrons (electricity) for both kinds of device, have improved greatly. For LEDs, IQE values of 80% for blue GaN LEDs, and nearly 100% for red AlGaInP LEDs have been achieved; and for photovoltaic devices, nearly 99% for GaAs and more than 97% for InGaN have been reported. The low efficiencies in LEDs are largely because of the refractive index mismatch between the LED and air, and the low efficiencies in photovoltaic cells for solar power applications are largely because of the spectral mismatch between the solar spectrum and the absorption spectrum of the cells. The light loss therefore becomes the most important factor in determining the efficiency of DC conversions, provided that state-of-the-art light-emitting devices and photovoltaic devices are used. Three technologies are provided in the present disclosure to reduce the light loss as far as possible, thus improving the energy conversion efficiency. The three technologies are: a spectrum matching between an emitting spectrum of the electricity-to-light conversion structure and an absorption spectrum of the light-to-electricity conversion structure to reduce a non-absorption loss of the photons and a thermalization loss, a refractive indices matching of materials on a light transmission path to reduce a total reflection loss and a Fresnel loss, and a light trap to reduce the energy loss caused by a light leakage. The three technologies will be illustrated in detail hereinafter.

In one embodiment, the semiconductor electricity converter may comprise one semiconductor electricity-to-light conversion structure and a plurality of semiconductor light-to-electricity conversion structures.

In another embodiment, the semiconductor electricity converter may comprise a plurality of semiconductor electricityto-light conversion structures and one semiconductor light-to-electricity conversion structure.

In another embodiment, the semiconductor electricity converter may comprise a plurality of semiconductor electricity-to-light conversion structures and a plurality of semiconductor light-to-electricity conversion structures.

In another embodiment, the semiconductor electricity converter may comprise one semiconductor electricity-to-light conversion structure and one semiconductor light-to-electricity conversion structure.

In addition, in a preferred embodiment, the plurality of semiconductor electricity-to-light conversion structures and the plurality of semiconductor light-to-electricity conversion structures may be connected in series. In another embodiment, the plurality of semiconductor light-to-electricity conversion structures may be connected in parallel and/or in series-parallel.

A semiconductor electricity converter according to a first embodiment, which is applied to an AC-AC voltage conversion, will be described as follows with reference to FIGS. 1a and 1b.

As shown in FIG. 1a, a semiconductor electricity converter is provided. The semiconductor electricity converter comprises: an AC input module for converting an input AC electric energy into a light energy and an AC output module for converting the light energy into an output AC electric energy. The AC input module comprises a plurality of semiconductor electricity-to-light conversion structures, and each semiconductor electricity-to-light conversion structure comprises an electricity-to-light conversion layer. The AC output module comprises a plurality of semiconductor light-to-electricity conversion structures, and each semiconductor light-to-electricity conversion structure comprises a light-to-electricity conversion layer. There is a spectrum matching between an emitting spectrum of each semiconductor electricity-to-light conversion structure 1 and an absorption spectrum of each semiconductor light-to-electricity conversion structure 2.

In one embodiment, the AC input module comprises: a first input branch AA' and a second input branch BB' connected with the first input branch AA' in parallel. The first input branch AA' works in a positive half cycle of an input AC current, and comprises $M_1$ semiconductor electricity-to-light conversion structures connected in series, where $M_1$ is a positive integer. The second input branch BB' works in a negative half cycle of the input AC current, and comprises $M_2$ semiconductor electricity-to-light conversion structures connected in series, where $M_2$ is a positive integer. Preferably, $M_1=M_2$.

In one embodiment, the AC output module comprises: a first output branch CC' and a second output branch DD' connected with the first output branch CC' in parallel. Polarities of the first output branch CC' and the second output branch DD' are opposite. A light transmission path is formed between the first output branch CC' and the first input branch AA'. The first output branch CC' comprises $N_1$ semiconductor light-to-electricity conversion structures connected in series, where $N_1$ is a positive integer. A light transmission path is formed between the second output branch DD' and the second input branch BB'. The second output branch DD' comprises $N_2$ semiconductor light-to-electricity conversion structures connected in series, where $N_2$ is a positive integer. Preferably, $N_1=N_2$.

Figure 1B:
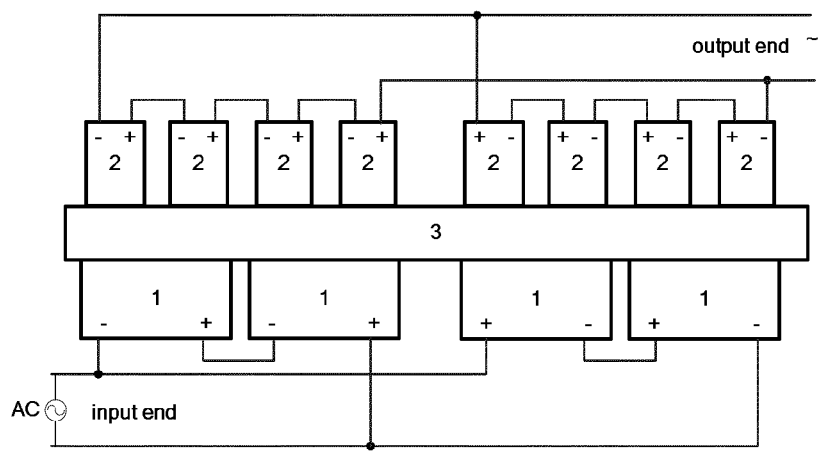
FIG. 1b is a cross-sectional view of the semiconductor electricity converter according to the first embodiment of the present disclosure.

FIG. 1b further shows a cross-sectional view of the semiconductor electricity converter according to the first embodiment, particularly, illustrating relative position and connection relationship among each part. As shown in FIG. 1b, in the semiconductor electricity converter, two semiconductor electricity-to-light conversion structures 1 are connected in series to constitute the first input branch, and another two semiconductor electricity-to-light conversion structures 1 are connected in series to constitute the second input branch. The first input branch and the second input branch are connected in parallel to constitute the AC input module. Four semiconductor light-to-electricity conversion structures 2 constitute the first output branch, and another four semiconductor light-to-electricity conversion structures 2 are connected in series to constitute the second output branch. The first output branch and the second output branch are connected in parallel to constitute the AC output module. It should be noted that, in this embodiment, $M_1$ and $M_2$ have a value of 2, and $N_1$ and $N_2$ have a value of 4, which are explanatory and illustrative, not being construed to limit the present disclosure. According to practice, modifications of a connection mode may be made in FIG. 1b in the embodiments without departing from spirit and principles of the disclosure. The semiconductor electricity converter also comprises an isolation layer 3, which will be illustrated in detail hereinafter.

In the above semiconductor electricity converter, a DC voltage $V_1$ is applied to an individual semiconductor electricity-to-light conversion structure 1 of the AC input module so as to inject carriers in the individual semiconductor electricity-to-light conversion structure 1 for recombination to generate photons. The photons are transmitted to an individual semiconductor light-to-electricity conversion structure 2 so as to excite out non-equilibrium carriers, and then separated by the internal electric field, and consequently a DC voltage $V_2$ is outputted from the individual semiconductor light-to-electricity conversion structure 2, thus realizing an energy transmission via photons. During an energy transmission process, in one aspect, $V_1$ and $V_2$ are dependent on material characteristic parameters, such as a material type, a strain characteristic, a bandgap energy or a doping concentration, of the electricity-to-light conversion structures 1 and the light-to-electricity conversion structures 2 respectively so as to realize an optimization of an energy transmission efficiency by adjusting a corresponding characteristic parameter; in another aspect, a voltage conversion may be realized by a number ratio of the electricity-to-light conversion structures 1 to the light-to-electricity conversion structures 2. For example, in the embodiment as shown in FIG. 1b, total output voltage/total input voltage=$2V_2/V_1$. It should be noted that, the total output voltage/total input voltage may be calculated according to a same principle in any following embodiment.

A semiconductor electricity converter according to a second embodiment, which is applied to an AC-DC current and voltage conversion, will be described as follows with reference to FIGS. 2a and 2b.

Figure 2A:
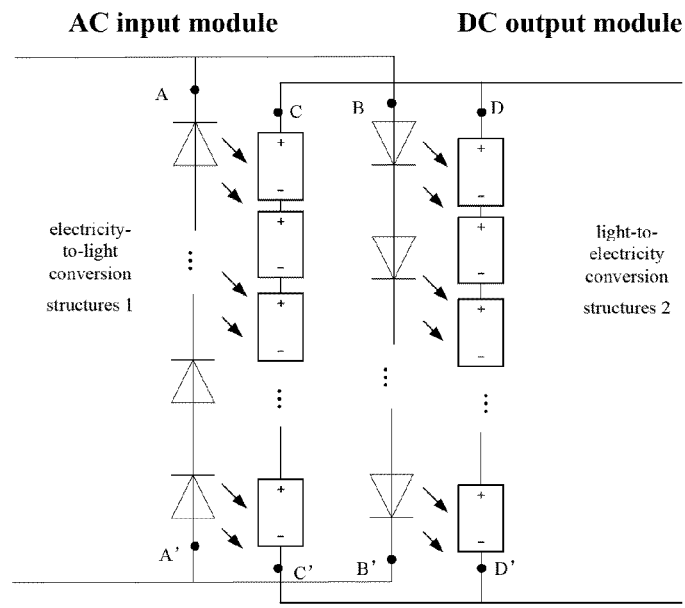
FIG. 2a is a schematic working principle diagram of a semiconductor electricity converter according to a second embodiment of the present disclosure.

As shown in FIG. 2a, a semiconductor electricity converter is provided. The semiconductor electricity converter comprises: an AC input module for converting an input AC electric energy into a light energy, and a DC output module for converting the light energy into an output DC electric energy. The AC input module comprises a plurality of semiconductor electricity-to-light conversion structures 1, and each semiconductor electricity-to-light conversion structure 1 comprises an electricity-to-light conversion layer. The DC output module comprises one or more semiconductor light-to-electricity conversion structures 2, and each semiconductor light-to-electricity conversion structure 2 comprises a light-to-electricity conversion layer. There is a spectrum matching between an emitting spectrum of each semiconductor electricity-to-light conversion structure 1 and an absorption spectrum of each semiconductor light-to-electricity conversion structure 2.

In one embodiment, the AC input module comprises: a first input branch AA' and a second input branch BB' connected with the first input branch AA' in parallel. The first input branch AA' works in a positive half cycle of an input AC current, and comprises $M_1$ semiconductor electricity-to-light conversion structures connected in series, where $M_1$ is a positive integer. The second input branch BB' works in a negative half cycle of the input AC current, and comprises $M_2$ semiconductor electricity-to-light conversion structures connected in series, where $M_2$ is a positive integer. Preferably, $M_1 = M_2$.

In one embodiment, the DC output module comprises: a first output branch CC' and a second output branch DD' connected with the first output branch CC' in parallel. Polarities of the first output branch CC' and the second output branch DD' are same. A light transmission path is formed between the first output branch CC' and the first input branch AA'. The first output branch CC' comprises $N_1$ semiconductor light-to-electricity conversion structures connected in series, where $N_1$ is a positive integer. A light transmission path is formed between the second output branch DD' and the second input branch BB'. The second output branch DD' comprises $N_2$ semiconductor light-to-electricity conversion structures connected in series, where $N_2$ is a positive integer. Preferably, $N_1 = N_2$.

It should be noted that the output branch may comprise only one output branch or two output branches connected in parallel. In a former case, a light transmission path is formed between the one output branch and the first input branch and between the one output branch and the second input branch. In a later case, a light transmission path is formed between one output branch and the first input branch, and a light transmission path is formed between the other output branch and the second input branch. However, in the later case, a diode for preventing reverse current is required to be connected in each output branch in series to avoid a phenomenon of "one output branch working to supply power while the other output branch not working to become a load of a former output branch".

Figure 2B:
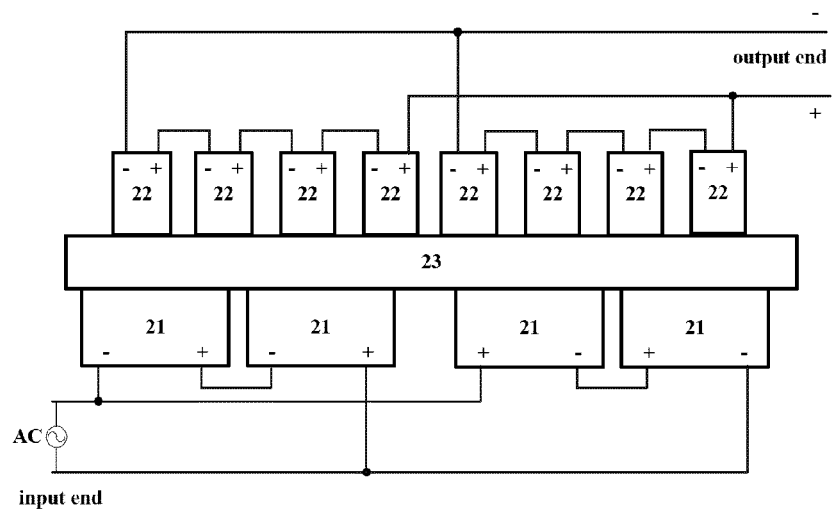
FIG. 2b is a cross-sectional view of the semiconductor electricity converter according to the second embodiment of the present disclosure.

FIG. 2b further shows a cross-sectional view of the semiconductor electricity converter according to the second embodiment, particularly, illustrating relative position and connection relationship among each part. As shown in FIG. 2b, in the semiconductor electricity converter, four semiconductor electricity-to-light conversion structures 1 constitute the first input branch and the second input branch. The first input branch and the second input branch further constitute the AC input module. Eight semiconductor light-to-electricity conversion structures 2 constitute the output branch, which further constitute the DC output module. The semiconductor electricity converter also comprises an isolation layer 3, which will be illustrated in detail hereinafter. It should be noted that, numbers of the semiconductor electricity-to-light conversion structures and the semiconductor light-to-electricity conversion structures, as well as connection modes thereof shown in FIG. 2b, are explanatory and illustrative, not being construed to limit the present disclosure.

A semiconductor electricity converter according to a third embodiment, which is applied to a DC-AC voltage conversion, will be described as follows with reference to FIGS. 3a and 3b.

Figure 3A:
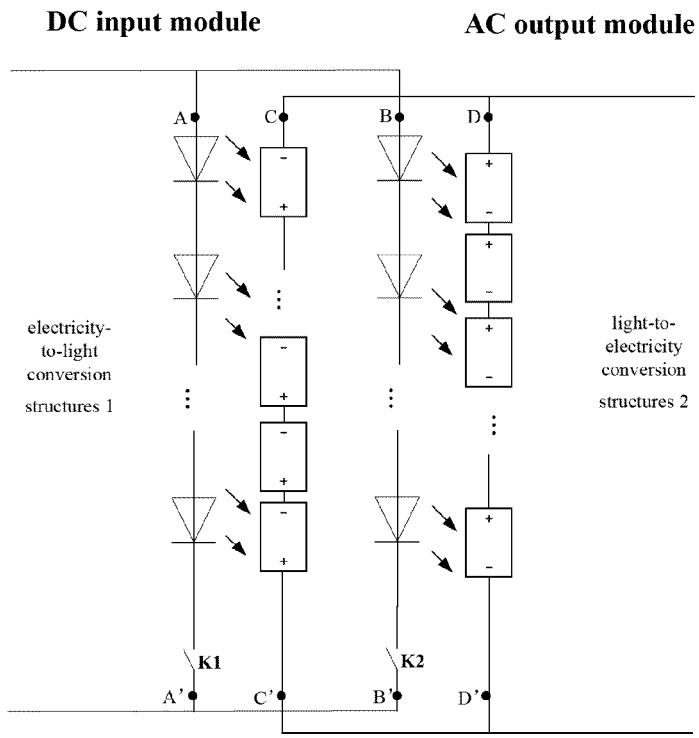
FIG. 3a is a schematic working principle diagram of a semiconductor electricity converter according to a third embodiment of the present disclosure.

As shown in FIG. 3a, a semiconductor electricity converter is provided. The semiconductor electricity converter comprises: a DC input module for converting an input DC electric energy into a light energy, and an AC output module for converting the light energy into an output AC electric energy. The DC input module comprises a plurality of semiconductor electricity-to-light conversion structures 1, and each semiconductor electricity-to-light conversion structure 1 comprises an electricity-to-light conversion layer. The AC output module comprises a plurality of semiconductor light-to-electricity conversion structures 2, and each semiconductor light-to-electricity conversion structure 2 comprises a light-to-electricity conversion layer. There is a spectrum matching between an emitting spectrum of each semiconductor electricity-to-light conversion structure 1 and an absorption spectrum of each semiconductor light-to-electricity conversion structure 2.

In one embodiment, the DC input module comprises: a first input branch AA' and a second input branch BB' connected with the first input branch AA' in parallel. The first input branch AA' comprises $M_1$ semiconductor electricity-to-light conversion structures 1 connected in series and a first control switch K1, where $M_1$ is a positive integer. The first control switch K1 switches the first input branch AA' on in a positive half cycle of an output AC current. The second input branch BB' comprises $M_2$ semiconductor electricity-to-light conversion structures 1 connected in series and a second control switch K2, where $M_2$ is a positive integer. The second control switch K2 switches the second input branch on in a negative half cycle of the output AC current. Preferably, $M_1 = M_2$.

In one embodiment, the AC output module comprises: a first output branch CC' and a second output branch DD' connected with the first output branch CC' in parallel. Polarities of the first output branch CC' and the second output branch DD' are opposite. A light transmission path is formed between the first output branch CC' and the first input branch AA'. The first output branch CC' comprises $N_1$ semiconductor light-to-electricity conversion structures 2 connected in series, where $N_1$ is a positive integer. A light transmission path is formed between the second output branch DD' and the second input branch BB'. The second output branch DD' comprises $N_2$ semiconductor light-to-electricity conversion structures 2 connected in series, where $N_2$ is a positive integer. Preferably, $N_1 = N_2$.

Figure 3B:
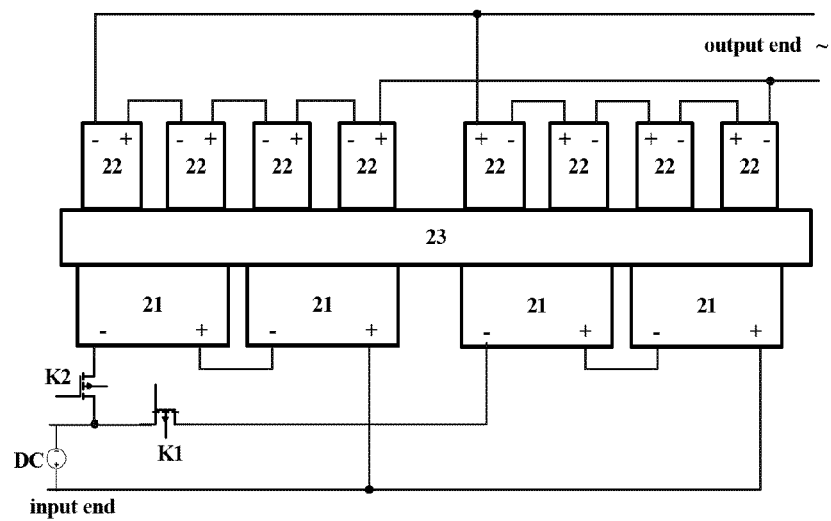
FIG. 3b is a cross-sectional view of the semiconductor electricity converter according to the third embodiment of the present disclosure.

FIG. 3b further shows a cross-sectional view of the semiconductor electricity converter according to the third embodiment, particularly, illustrating relative position and connection relationship among each part. As shown in FIG. 3b, in the semiconductor electricity converter, four semiconductor electricity-to-light conversion structures 1 and the control switches K1 and K2 constitute the first input branch and the second input branch. The first input branch and the second input branch further constitute the DC input module. Eight semiconductor light-to-electricity conversion structures 2 constitute the first output branch and the second output branch, which further constitute the AC output module. The semiconductor electricity converter also comprises an isolation layer 3, which will be illustrated in detail hereinafter. It should be noted that, numbers of the semiconductor electricity-to-light conversion structures and the semiconductor light-to-electricity conversion structures, as well as connection modes thereof shown in FIG. 3b, are explanatory and illustrative, not being construed to limit the present disclosure.

A semiconductor electricity converter according to a fourth embodiment, which is applied to a DC-DC voltage conversion, will be described as follows with reference to FIGS. 4a and 4b.

Figure 4A:
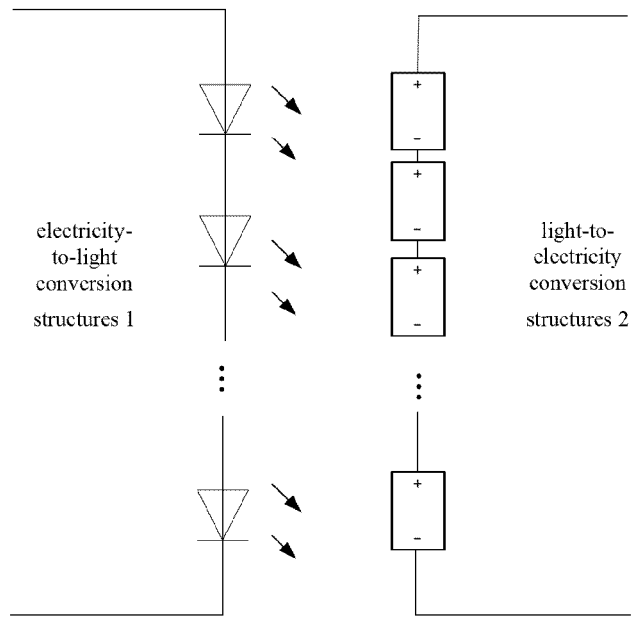
FIG. 4a is a schematic working principle diagram of a semiconductor electricity converter according to a fourth embodiment of the present disclosure.

As shown in FIG. 4a, a semiconductor electricity converter is provided. The semiconductor electricity converter comprises: a DC input module for converting an input DC electric energy into a light energy, and a DC output module, for converting the light energy into an output DC electric energy.

The DC input module comprises M semiconductor electricity-to-light conversion structures, where M is a positive integer, and each semiconductor electricity-to-light conversion structure comprises an electricity-to-light conversion layer. The DC output module comprises N semiconductor light-to-electricity conversion structures 2, where N is a positive integer, and each semiconductor light-to-electricity conversion structure 2 comprises a light-to-electricity conversion layer. There is a spectrum matching between an emitting spectrum of each semiconductor electricity-to-light conversion structure 1 and an absorption spectrum of each semiconductor light-to-electricity conversion structure 2.

Figure 4B:
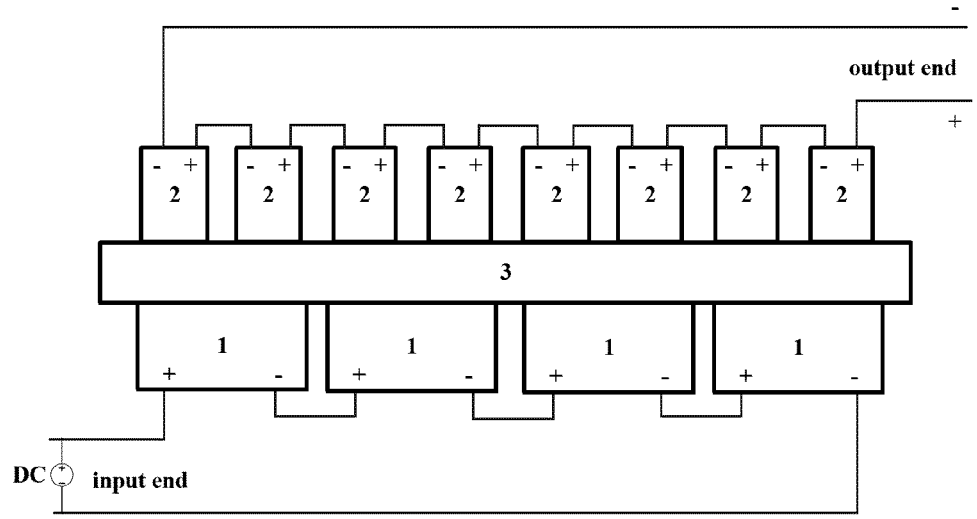
FIG. 4b is a cross-sectional view of the semiconductor electricity converter according to the fourth embodiment of the present disclosure.

FIG. 4b further shows a cross-sectional view of the semiconductor electricity converter according to the fourth embodiment, particularly, illustrating relative position and connection relationship among each part. As shown in FIG. 4b, in the semiconductor electricity converter, four semiconductor electricity-to-light conversion structures I constitute the DC input module. Eight semiconductor light-to-electricity conversion structures 2 constitute the AC output module. The semiconductor electricity converter also comprises an isolation layer 3, which will be illustrated in detail hereinafter. It should be noted that, numbers of the semiconductor electricity-to-light conversion structures and the semiconductor light-to-electricity conversion structures, as well as connection modes thereof shown in FIG. 4b, are explanatory and illustrative, not being construed to limit the present disclosure.

With the semiconductor electricity converter according to an embodiment of the present disclosure, by disposing the electricity-to-light conversion layer at an input end of the semiconductor electricity converter and making use of light radiations generated by energy level transitions of semiconductor electrons, an electricity is converted into a light for transmission; and by disposing the light-to-electricity conversion layer at an output end of the semiconductor electricity converter, the light is converted back into the electricity for outputting. Moreover, in one aspect, because unit voltages of the input end and the output end are dependent on material characteristic parameters of the electricity-to-light conversion layer in the electricity-to-light conversion structure and the light-to-electricity conversion layer in the light-to-electricity conversion structure respectively, if different numbers of electricity-to-light conversion structures and light-to-electricity conversion structures are connected in series at the input end and the output end respectively, a voltage conversion may be realized by a number ratio of the electricity-to-light conversion structures to the light-to-electricity conversion structures; in another aspect, a current conversion may be realized by a connecting relationship of the electricity-to-light conversion structures at the input end and/or that of the light-to-electricity conversion structures at the output end. Therefore, the voltage conversion and the current conversion can be realized simultaneously. In addition, the semiconductor electricity converter further has advantages of high voltage withstand, non-electromagnetic radiation, non-coil structure, safety and reliability, small volume, long lifetime, light weight, convenient installation and maintenance, etc.

For the above four semiconductor electricity converters according to the above four embodiments, additional features will be described as follows.

In one embodiment, each semiconductor electricity-to-light conversion structure 1 comprises: a light emitting diode (LED), a resonant cavity light emitting diode (RC-LED), a laser diode (LD), a quantum clot light emitting device and an organic light emitting device. A material of the electricity-to-light conversion layer comprises any one of AlGaInP, GaN, InGaN, InGaN, AlGaInN, ZnO, AlGaInAs, GaAs, InGaAs, InGaAsP, AlGaAs, AlGaInSb, InGaAsNSb, other groups III-V and II-VI semiconductor materials and a combination thereof, organic light emitting materials and quantum dot light emitting materials.

In one embodiment, each semiconductor light-to-electricity conversion structure comprises: a semiconductor photovoltaic device, a quantum dot photovoltaic device and an organic material photovoltaic device. A material of the light-to-electricity conversion layer comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials.

It should be noted that the spectrum matching between the emitting spectrum of the electricity-to-light conversion layer and the absorption spectrum of the light-to-electricity conversion layer means that a characteristic of a light emitted by the electricity-to-light conversion layer is matched with that of a light with an optimized light-to-electricity conversion efficiency of the light-to-electricity conversion layer so as to increase the energy conversion efficiency of the semiconductor electricity converter and reduce an energy loss of photons in a conversion process. Specifically, the light emitted by the electricity-to-light conversion layer may be a monochromatic light whose frequency is corresponding to a maximum absorption frequency of the light-to-electricity conversion layer, and also may be a light with another specific frequency which may enable the photovoltaic effect with a quantum efficiency in the light-to-electricity conversion layer to be larger than 1. One optimized case is that the photon energy of the light emitted by the electricity-to-light conversion layer should be just absorbed by the light-to-electricity conversion layer, but should not be over large to cause an excess thermalization loss. One possible ideal case is that a bandgap energy of an active material of the electricity-to-light conversion layer is substantially equal to that of the light-to-electricity conversion layer so as to not only ensure the light absorption, but also not cause the excess thermalization loss. It should be noted that, in this embodiment, the monochromatic light has certain spectrum width (for instance, the red light LED has a spectrum width of about 20nm) rather than are limited to some specific frequency point.

Figure 5:
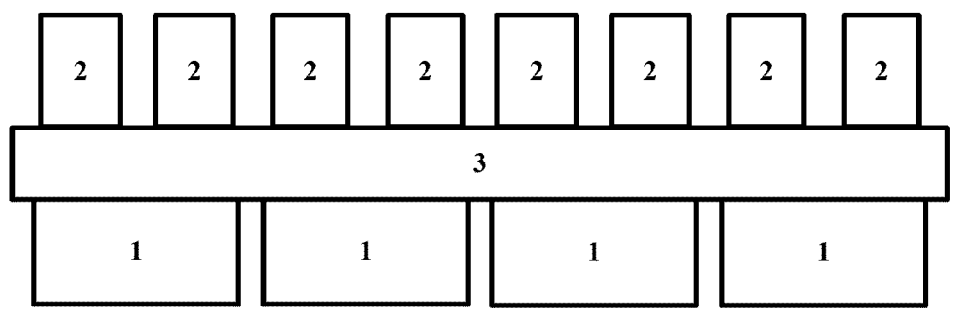
FIG. 5 is a cross-sectional view of a double-layer structure semiconductor electricity converter with an isolation layer according to an embodiment of the present disclosure.

In one embodiment, the semiconductor electricity converter may be a double-layer structure semiconductor electricity converter as shown in FIG. 5. The semiconductor electricity converter comprises the isolation layer 3. Four semiconductor electricity-to-light conversion structures 1 and eight semiconductor light-to-electricity conversion structures 2 are located at both sides of the isolation layer respectively. The isolation layer 3 is transparent to a light emitted by each electricity-to-light conversion layer, which means that a bandgap energy of the isolation layer 3 is larger than an energy of a photon so as to ensure a nonoccurrence of transitions between energy bands which may cause a photon loss. The isolation layer 3 is used for an electrical isolation between the four semiconductor electricity-to-light conversion structures 1 and the eight semiconductor light-to-electricity conversion structures 2. The electrical isolation may be realized by an insulation characteristic of a material or by a reverse biased PN junction structure. In one embodiment, a material of the isolation layer 3 may be an insulation material, comprising any one of $Al_2O_3$, AlN, $SiO_2$, MgO, $Si_3N_4$, BN, diamond, $LiAlO_2$, $LiGaO_2$, GaAs, SiC, $TiO_2$, $ZrO_2$, $SrTiO_3$, $Ga_2O_3$, ZnS, SiC, $MgAl_2O_4$, $LiNbO_3$, $LiTaO_3$, yttrium aluminum garnet (YAG) crystal, $KNbO_3$, LiF, $MgF_2$, $BaF_2$, GaF$_2$, LaF$_3$, BeO, GaP, GaN and a combination thereof; or any one of a rare earth oxide and a combination of different rare earth oxides, and also may be a liquid transparent insulating dielectric such as DI water, CCl$_4$, CS$_2$ or a gaseous transparent insulating dielectric such as SF$_6$, which is filled in a shell. When taking into account of a lattice matching and a process condition, preferably, the material of the isolation layer 3 may be Al$_2$O$_3$, AlN, SiO$_2$, MgO, Si$_3$N$_4$, BN, ZrO$_2$, TiO$_2$, diamond. LiAlO$_2$, LiGaO$_2$, semi-insulating GaAs, semi-insulating SiC, semi-insulating GaP, GaN and a combination thereof; or any one of a rare earth oxide and a combination of different rare earth oxides. In another embodiment, the material of the isolation layer or the substrate layer may be a semiconductor material, comprising any one of GaP, GaAs, InP, GaN, Si, Ge, GaSb, other semiconductor material transparent to the light, and a combination thereof. PN junctions are formed between each semiconductor electricity-to-light conversion structure 1 and the isolation layer 3 and between each semiconductor light-to-electricity conversion structure 2 and the isolation layer 3 by doping and implanting the isolation layer 3, and then the PN junctions are reverse biased to forbid an on-state current thus realizing the electrical isolation.

Figure 6:
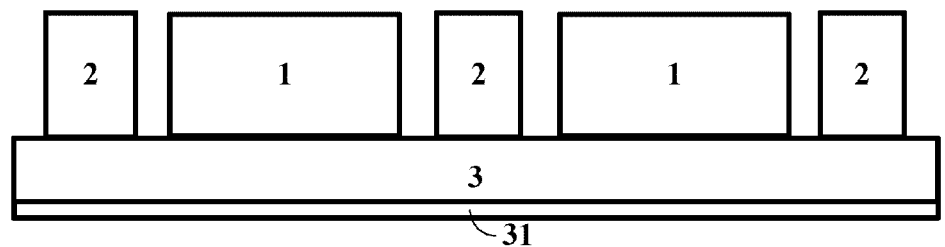
FIG. 6 is a cross-sectional view of a single-layer structure semiconductor electricity converter with a substrate layer according to an embodiment of the present disclosure.

In one embodiment, the semiconductor electricity converter may be a single-layer structure semiconductor electricity converter as shown in FIG. 6. The semiconductor electricity converter comprises a substrate layer 3. Two semiconductor electricity-to-light conversion structures 1 and two semiconductor light-to-electricity conversion structures 2 are located at a same side of the substrate layer 3, and the substrate layer 3 has a reflecting structure 31. The substrate layer 3 is transparent to the light emitted by each electricity-to-light conversion layer, which means that a bandgap of the substrate layer 3 is larger than the energy of the photon so as to ensure the nonoccurrence of transitions between energy bands which may cause the loss of the photons. The reflecting structure 31 may change a transmission direction of the light emitted by the electricity-to-light conversion layer toward to the light-to-electricity conversion layer, thus realizing the enemy transmission. The substrate layer 3 is also used for the electrical isolation between the two semiconductor electricity-to-light conversion structures 1 and the two semiconductor light-to-electricity conversion structures 2, beside for supporting. The electrical isolation may be realized by an insulation characteristic of a material or by a reverse biased PN junction structure. In one embodiment, a material of the substrate layer 3 may be an insulation material, comprising any one of Al$_2$O$_3$, AlN, SiO$_2$, MgO, Si$_3$N$_4$, BN, diamond, LiAlO$_2$, LiGaO$_2$, GaAs, SiC, TiO$_2$, ZrO$_2$, SrTiO$_3$, Ga$_2$O$_3$, ZnS, SiC, MgAl$_2$O$_4$, LiNbO$_3$, LiTaO$_3$, yttrium aluminium garnet (YAG) crystal, KNbO$_3$, LiF, MgF$_2$, BaF$_2$, GaF$_2$, LaF$_3$, BeO, GaP, GaN and a combination thereof; or any one of a rare earth oxide and a combination of different rare earth oxides, and also may be a liquid transparent insulating dielectric such as DI water, CCl$_4$, CS$_2$ or a gaseous transparent insulating dielectric such as SF$_6$. When taking into account of a lattice matching and a process condition, preferably, the material of the substrate layer 3 may be Al$_2$O$_3$, AlN, SiO$_2$, MgO, Si$_3$N$_4$, BN, ZrO$_2$, TiO$_2$, diamond, LiAlO$_2$, LiGaO$_2$, semi-insulating GaAs, semi-insulating SiC, semi-insulating GaP, GaN and a combination thereof; or any one of a rare earth oxide and a combination of different rare earth oxides. In another embodiment, the material of the isolation layer or the substrate layer may be a semiconductor material, comprising any one of GaP, GaAs, InP, GaN, Si, Ge, GaSb, other semiconductor material transparent to the light, and a combination thereof. PN junctions are formed between each semiconductor electricity-to-light conversion structure 1 and the substrate layer 3 and between each semiconductor light-to-electricity conversion structure 2 and the substrate layer 3 by doping and implanting the substrate layer 3, and then the PN junctions are reverse biased to forbid an on-state current thus realizing the electrical isolation.

Figure 7:
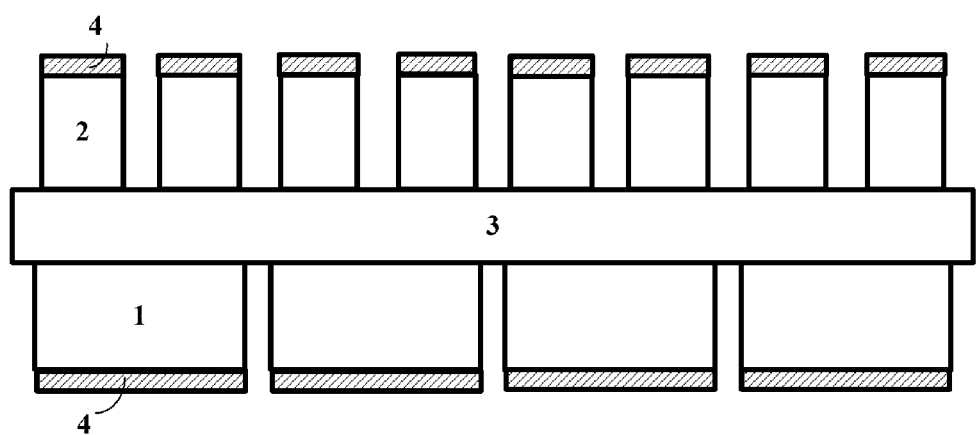
FIG. 7 is a cross-sectional view of a semiconductor electricity converter with a light trap according to an embodiment of the present disclosure.

In one embodiment, the semiconductor electricity converter may further comprise a light trap for trapping a light inside of the semiconductor electricity converter, particularly between the electricity-to-light conversion layer and the light-to-electricity conversion layer, so as to prevent the energy loss caused by the light leakage and improve an energy conversion efficiency. FIG. 7 is a cross-sectional view of a semiconductor electricity converter with a light trap according to an embodiment. The light trap 4 may be a reflecting structure, an optical grating, a photonic crystal or other form. It should be noted that, a position of the light trap 4 may be varied according to practice while ensuring an effect, which will be described in detail hereinafter.

In one embodiment, a refractive index of a material of each layer in a light transmission path is matched with each other. In other words, refractive indices of each semiconductor electricity-to-light conversion structure 1, the isolation layer 3 (or the substrate layer 3) and each semiconductor light-to-electricity conversion structure 2 meet a matching condition, which means that the refractive indices of each semiconductor electricity-to-light conversion structure 1, the isolation layer 3 (or the substrate layer 3) and each semiconductor light-to-electricity conversion structure 2 are approximate, or the refractive indices of each semiconductor electricity-to-light conversion structure 1, the isolation layer 3 (or the substrate layer 3) and each semiconductor light-to-electricity conversion structure 2 are increased in a light transmission direction. A total reflection occurring at each interface during the light transmission process may be effectively avoided, thus improving a light-to-electricity energy conversion efficiency.

In order to make those skilled in the art better understand the present disclosure, the semiconductor electricity-to-light conversion structure 1 and the semiconductor light-to-electricity conversion structure 2 may be further described in detail as follows. For convenience purpose, it is provided that the semiconductor electricity converter has the double-layer structure, a number of the semiconductor electricity-to-light conversion structure 1 and a number of the semiconductor light-to-electricity conversion structure 2 are one, and the DC-DC voltage conversion is realized.

Figure 8:
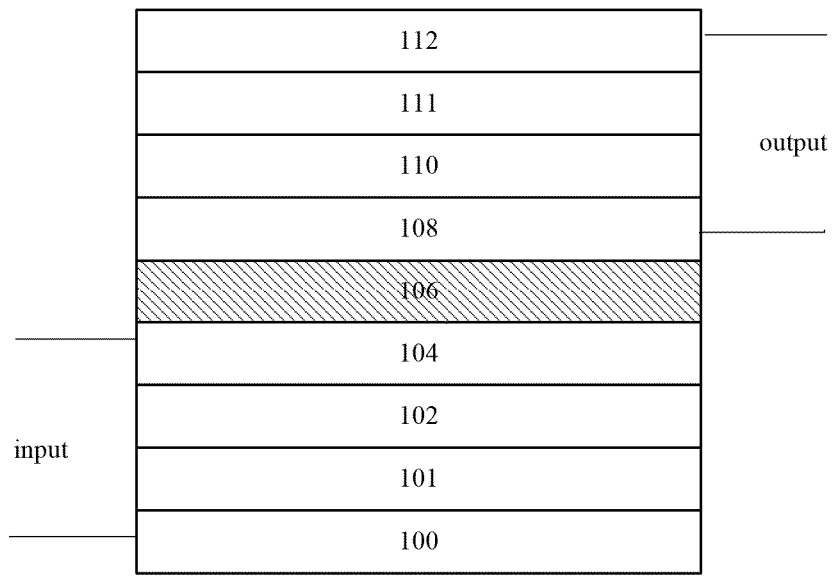
FIG. 8 is a cross-sectional view of a semiconductor electricity converter according to a fifth embodiment of the present disclosure.

FIG. 8 is a cross-sectional view of a semiconductor electricity converter according to a fifth embodiment. The semiconductor electricity converter comprises: a first electrode layer 100; an electricity-to-light conversion layer 102 formed on the first electrode layer 100; a second electrode layer 104 formed on the electricity-to-light conversion layer 102; a first isolation layer 106 formed on the second electrode layer 104; a third electrode layer 108 formed on the first isolation layer 106; a light-to-electricity conversion layer 110 formed on the third electrode layer 108; and a fourth electrode layer 112 formed on the light-to-electricity conversion layer 110. The electricity-to-light conversion layer 102 is for converting an input DC electric energy into the working light in a desired wavelength range. The working light comprises one or more wave bands in a whole spectral range from an ultraviolet light of 100 nm wavelength to an infrared light of 10 μm wavelength. The monochromatic light, such as a red light of 620 nm, a blue light of 460 nm or a violet light of 380 nm, is preferred to fabricate the electricity-to-light conversion layer in a mature prior art. For example, a structure and a material with high quantum efficiency and high electricity-to-light conversion efficiency may be used for forming the electricity-to-light conversion layer 102. Specifically, the electricity-to-light conversion layer 102 may be a LED structure or a laser structure generally including an active layer, a cladding layer, a current spreading layer, a P or N contact layer, etc, in which the active layer may be a multi-quantum well structure. The electricity-to-light conversion layer with the laser structure may further comprise a resonant cavity, and the electricity-to-light conversion layer with the LED structure may further comprise a resonant cavity LED structure. A material of each electricity-to-light conversion layer 102 may be selected based on material characteristics (such as defect density, or energy band structure) and required light spectrum characteristics (such as wavelength range). For example, the material of the electricity-to-light conversion layer 102 comprises any one of AlGaInP in a red-to-yellow wavelength range; GaN and InGaN in an ultraviolet wavelength range; InGaN, AlGaInN, and ZnO in a blue-to-violet wavelength range; AlGaInAs, GaAS, InGaAs, InGaAsP, and AlGaAs, in a red wavelength range or an infrared wavelength range; other group III nitride compounds, group III arsenide compounds or phosphide compounds; and a combination thereof, in which the material with low defect density and high electricity-to-light conversion efficiency (such as AlGaInP, InGaN, or GaN) is preferred.

The light-to-electricity conversion layer 110 is for converting the light into an electricity to realize the transformation. A material of the light-to-electricity conversion layer 110 comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb. InGaAsNSb, other group III-V direct bandgap semiconductor materials and a combination thereof, organic photovoltaic materials and quantum dot photovoltaic materials. The material of the light-to-electricity conversion layer 110 is generally selected from the direct bandgap semiconductor material, and thus an energy band structure of the electricity-to-light conversion layer 102 is matched with that of the light-to-electricity conversion layer 110, so as to allow the spectrum of the working light emitted by the electricity-to-light conversion layer 102 to be matched with a spectrum with a maximum absorption efficiency of the light-to-electricity conversion layer 110, to achieve a maximum light-to-electricity conversion efficiency.

The first isolation layer 106, the second electrode layer 104 and the third electrode layer 108 are transparent to the working light emitted by the electricity-to-light conversion layer 102. In this embodiment, a bandgap energy of a material of each of the second electrode layer 104, the first isolation layer 106 and the third electrode layer 108 should be larger than the photon energy of the working light emitted by the electricity-to-light conversion layer 102 so as to prevent the second electrode layer 104, the first isolation layer 106 and the third electrode layer 108 from absorbing the working light, thus improving the light transmission efficiency.

In one embodiment, the refractive indices of materials of the first isolation layer 106, the second electrode layer 104 and the third electrode layer 108 may be matched with the refractive index of the material of the electricity-to-light conversion layer 102 and the light-to-electricity conversion layer 110 to avoid the total reflection occurring at each interface during the light transmission process. Because the total reflection occurs if and only if a light enters from a material with a larger refractive index to a material with a smaller refractive index, in a preferred embodiment, the refractive indices of materials of the second electrode layer 104, the first isolation layer 106, the third electrode layer 108 and the light-to-electricity conversion layer 110 are approximate to avoid the total reflection occurring at each interface when the light is transmitted from the electricity-to-light conversion layer 102 to the light-to-electricity conversion layer 110. In another more preferred embodiment, refractive indices of materials are increased in an order from the second electrode layer 104 and to the first isolation layer 106 and to the third electrode layer 108 and to the light-to-electricity conversion layer 110. "Increased in an order" means that the refractive index of material of each layer is not less than that of a former layer thereof, that is, the refractive indices of materials of some layers may be same with that of a former layer thereof, while the refractive index of material of respective layer increases overall. In yet another more preferred embodiment, the refractive indices of materials of the second electrode layer 104, the first isolation layer 106, the third electrode layer 108 and the light-to-electricity conversion layer 110 are increased gradually. In one aspect, a total reflection, which occurs when a light (including a light emitted by the electricity-to-light conversion layer 102 and a light reflected by respective electrode layer and respective reflection layer) is transmitted from the electricity-to-light conversion layer 102 to the light-to-electricity conversion layer 110, may be avoided to increase the transmission efficiency of the light. In another aspect, a total reflection, which occurs when a light (including a light emitted by the light-to-electricity conversion layer 110 and a light reflected by the third electrode layer, the fourth electrode layer and the second reflection layer) is transmitted from the light-to-electricity conversion layer to the electricity-to-light conversion layer, may be promoted to trap more lights in the light-to-electricity conversion layer, thus improving the light-to-electricity conversion efficiency.

In addition, different material layers may have roughened surfaces, patterned surfaces or photonic crystal structures so as to reduce the light transmission loss. In one preferred embodiment, at least one of the electricity-to-light conversion layer 102, the second electrode layer 104, the first isolation layer 106, the third electrode layer 110 and the light-to-electricity conversion layer 110 has a roughened surface, a patterned surface or a photonic crystal structure to increase a transmittance of light and decrease the reflection of light.

The first isolation layer 106 is used for achieving the electrical isolation between the plurality of semiconductor electricity-to-light conversion structures 1 and the plurality of semiconductor light-to-electricity conversion structures 2 to allow an input voltage and an output voltage not to influence each other. Moreover, the first isolation layer 106 is transparent to the working light, to allow a light carrying energy to be transmitted from each semiconductor electricity-to-light conversion structure 1 to each semiconductor light-to-electricity conversion structure 2, thus realizing the energy transmission and eventually realizing a voltage conversion. A thickness of the first isolation layer 106 is dependent on the input and output voltages and an insulating requirement. The thicker the first isolation layer 106, the better the insulating effect is, the higher the breakdown voltage which the first isolation layer 106 may bear is, however, the larger the attenuation to the light is. Therefore, a determining principle of the thickness of the first isolation layer 106 is that the thinner the better under the conditions where the insulating requirement is met. According to the above requirement, in this embodiment, preferably, a material of the first isolation layer 106 may be $Al_2O_3$, AlN, $SiO_2$, MgO, $Si_3N_4$, BN, $ZrO_2$, $TiO_2$, diamond, $LiAlO_2$, $LiGaO_2$, semi-insulating GaAs, semi-insulating SiC, semi-insulating GaP, GaN and a combination thereof; or any one of a rare earth oxide and a combination of different rare earth oxides. A material of each of the second electrode layer 104 and the third electrode layer 108 comprises any one of heavily doped semiconductor materials including GaAs, GaN, GaP, AlGaInP, AlGaInN, AlGaInAs, transparent conductive oxide materials including ITO (indium tin oxide), SnO$_2$, ZnO and a combination thereof.

In one preferred embodiment, a first reflection layer 101 is formed between the first electrode layer 100 and the electricity-to-light conversion layer 102; and a second reflection layer 111 is formed between the fourth electrode layer 112 and the light-to-electricity conversion layer 110. As shown in FIG. 8, a light is trapped to reflect forward and backward between the electricity-to-light conversion layer 102 and the light-to-electricity conversion layer 110 to prevent the leakage of the light, thus improving the conversion efficiency of the light. A material of a reflection layer needs to meet requirements of high reflection efficiency to the working light, stablility, low contact resistance and good conductivity, which may be realized via a Bragg reflector structure or an omnidirectional metal reflector structure. For the Bragg reflector structure, a reflection is realized by multi-layer structure with materials of different refractive indices, for example, the reflection is realized by a multi-layer structure made of two materials with different refractive indices, such as, GaAs and AlAs with a refractive index difference of 0.6, or Si and REO (rear earth oxide) with a refractive index difference of 2.2. For the omnidirectional metal reflector structure, the reflection may be realized by depositing a metal with high electrical conductivity and high thermal conductivity. The metal may be any one of Ag, Au, Cu, Ni, Al, Sn, Co, W and a combination thereof. Because thicknesses of back electrode layers (i.e., the first electrode layer 100 and the fourth electrode layer 112) contacting with the reflection layer is larger, the reflection layer with the omnidirectional metal reflector structure also has a function of heat dissipation.

The first electrode layer 100 and the fourth electrode layer 112 are used as lead-out electrodes to input and output currents. Because the first electrode layer 100 and the fourth electrode layer 112 are not required to be transparent to the working light, the first electrode layer 100 and the fourth electrode layer 112 may be a single layer and/or a multi-layer composite structure formed by a metal, an alloy, a ceramic, a glass, a plastic, a conductive oxide, etc., in which a low resistance metal such as Cu. More preferably, a thickness of a metal electrode layer may be increased to reduce the resistance and be favorable for heat dissipation.

Figure 9:
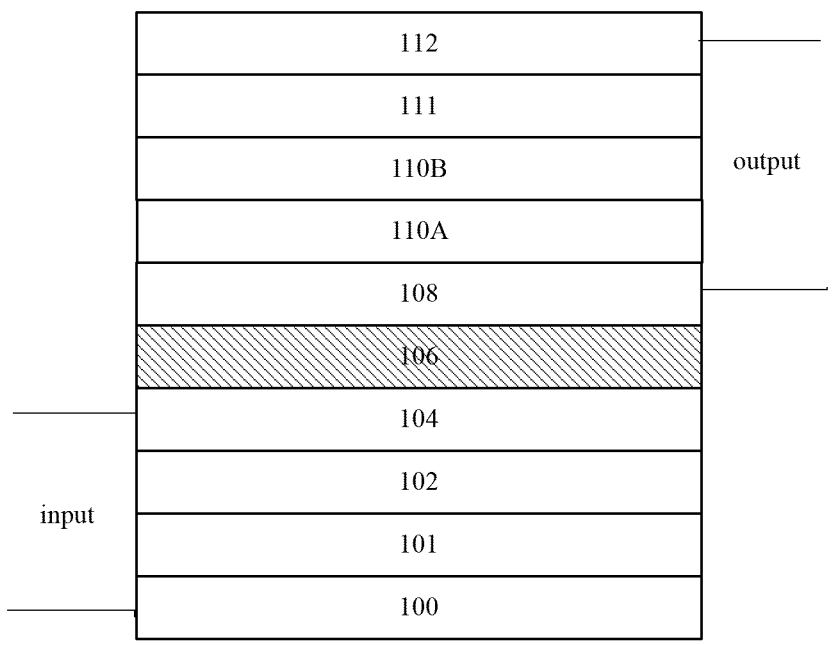
FIG. 9 is a cross-sectional view of a semiconductor electricity converter according to a sixth embodiment of the present disclosure.

It should be noted that an input voltage threshold and an output voltage threshold of the semiconductor voltage conversion structure are dependent on material characteristic parameters, such as a bandgap energy or a doping concentration, of the electricity-to-light conversion layer and the light-to-electricity conversion layer respectively so as to realize the voltage conversion by adjusting a corresponding characteristic parameter. Furthermore, an expected transformation may be realized by adjusting a number ratio of the electricity-to-light conversion layer 102 and the light-to-electricity conversion layer 110 to raise a voltage conversion ratio. For example, as shown in FIG. 9, the semiconductor voltage conversion structure comprises one electricity-to-light conversion layer 102 and two light-to-electricity conversion layers 110A and 110B. Compared with the semiconductor voltage conversion structure comprising a single electricity-to-light conversion layer and a single light-to-electricity conversion layer, the voltage conversion ratio is increased.

Figure 10:
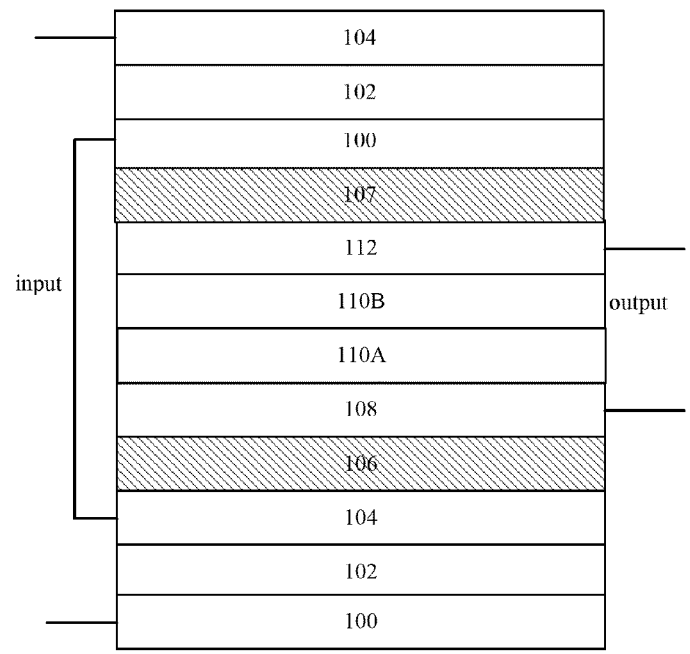
FIG. 10 is a cross-sectional view of a semiconductor electricity converter according to a seventh embodiment of the present disclosure.

In one preferred embodiment, the first electrode layer 100, the electricity-to-light conversion layer 102 formed on the first electrode layer 100, and the second electrode layer 104 formed on the electricity-to-light conversion layer 102 form one semiconductor electricity-to-light conversion structure, while the third electrode layer 108, the light-to-electricity conversion layer 110 formed on the third electrode layer 108, and the fourth electrode layer 112 formed on the light-to-electricity conversion layer 110 form one semiconductor light-to-electricity conversion structure. The semiconductor voltage conversion structure may also comprise a plurality of semiconductor electricity-to-light conversion structures and a plurality of semiconductor light-to-electricity conversion structures alternately stacked layer by layer. The isolation layer is formed between each adjacent semiconductor electricity-to-light conversion structure and semiconductor light-to-electricity conversion structure to further increase a DC voltage conversion ratio. The plurality of semiconductor electricity-to-light conversion structures (or the plurality of semiconductor light-to-electricity conversion structures) are connected in series. A structure of each semiconductor electricity-to-light conversion structure (or each semiconductor light-to-electricity conversion structure) may refer to the structure described in above embodiments. FIG. 10 is a cross-sectional view of the semiconductor voltage conversion structure including two electricity-to-light conversion structure and one light-to-electricity conversion structure according to an embodiment of the present disclosure. The first isolation layer 106 and a second isolation layer 107 are formed between the semiconductor electricity-to-light conversion structure and the semiconductor light-to-electricity conversion structure respectively. It should be noted that, in this semiconductor voltage conversion structure, a material of the first electrode layer and the fourth electrode layer of each middle semiconductor electricity-to-light conversion structure and semiconductor light-to-electricity conversion structure except a top and a bottom semiconductor electricity-to-light conversion structures (or the semiconductor light-to-electricity conversion structures) may be any one of a heavily doped semiconductor material, for example, GaAs, GaN, AlGaInP, AlGaInN, or AlGaInAs; transparent conductive oxide materials, for example, ITO, SnO$_2$, or ZnO; and a combination thereof; but rather than a metal so as to be favorable for the light transmission.

In one embodiment, one single semiconductor electricity-to-light conversion structure or one single semiconductor light-to-electricity conversion structure with large area may be divided into a plurality of units with small area which may be then connected in parallel by a planar metallization interconnection process to reduce parasitic resistance, thus reducing the energy loss of the semiconductor electricity converter during the energy transmission process. In one embodiment, the input end comprises m groups of semiconductor electricity-to-light conversion structures, each group of semiconductor electricity-to-light conversion structures comprising x semiconductor electricity-to-light conversion units; and the output end comprises n groups of semiconductor light-to-electricity conversion structures, each group of semiconductor light-to-electricity conversion structures comprising y semiconductor light-to-electricity conversion units.

In order to make those skilled in the art better understand the present disclosure, the semiconductor electricity converter may be further described in detail with reference to FIGS. 11-20. It should be noted that, the plurality of semiconductor electricity-to-light conversion structures and the plurality of semiconductor light-to-electricity conversion structures shown in FIGS. 11-20 are connected in series respectively, and the semiconductor electricity converters shown in FIGS. 11-20 all belong to the DC-DC voltage conversion, which are merely for the convenience of illustration, but shall not be construed to limit the present disclosure.

Figure 11:
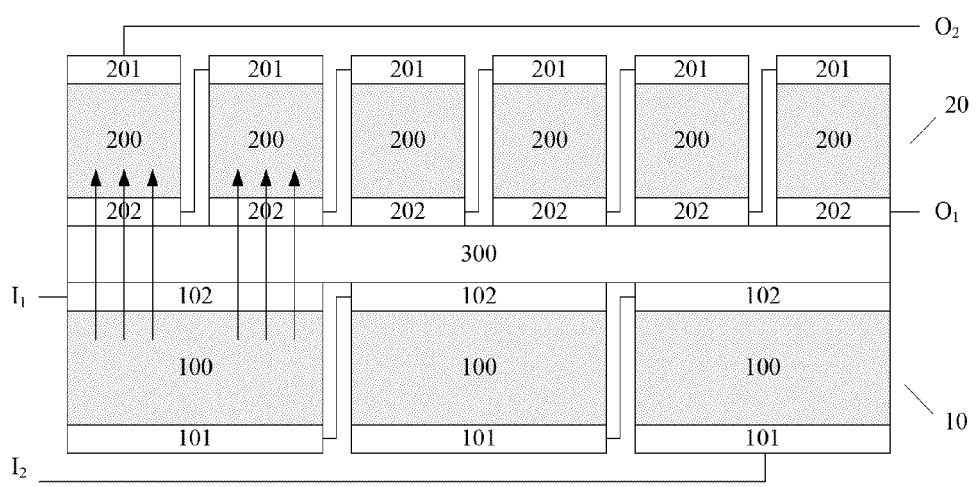
FIG. 11 is a cross-sectional view of a semiconductor electricity converter according to an embodiment of the present disclosure.

FIG. 11 is a cross-sectional view of a semiconductor electricity converter according to an embodiment of the present disclosure.

As shown in FIG. 11, the semiconductor electricity converter comprises 3 semiconductor electricity-to-light conversion structures 10 connected in series and 6 semiconductor light-to-electricity conversion structures 20 connected in series. It should be noted that "3" and "6" are merely for the convenience of illustration, but shall not be construed to limit the present disclosure. The working light spectrum of the semiconductor electricity-to-light conversion structures 10 is matched with that of the semiconductor light-to-electricity conversion structures 20, and the isolation layer 300 is transparent to the working The isolation layer 300 is located between the three semiconductor electricity-to-light conversion structures 10 connected in series and the six semiconductor light-to-electricity conversion structures 20 connected in series. For the convenience of illustration, portions of each semiconductor electricity-to-light conversion structure 10 and each semiconductor light-to-electricity conversion structure 20 which are adjacent to the isolation layer 300 are referred to as bottoms of each semiconductor electricity-to-light conversion structure 10 and each semiconductor light-to-electricity conversion structure 20 respectively, and the opposite portions of each semiconductor electricity-to-light conversion structure 10 and each semiconductor light-to-electricity conversion structure 20 are referred to as tops of each semiconductor electricity-to-light conversion structure 10 and each semiconductor light-to-electricity conversion structure 20 respectively.

An electric energy is input to the three semiconductor electricity-to-light conversion structures 10 connected in series via a lead wire 11 and a lead wire 12 to emit the working light. In a vertical direction, each semiconductor electricity-to-light conversion structure 10 comprises an electricity-to-light conversion layer 100 for converting energy, a first contact layer 101 located on a top of each electricity-to-light conversion layer 100, and a second contact layer 102 located on a bottom of each electricity-to-light conversion layer 100. Each second contact layer 102 is transparent to the working light emitted by the electricity-to-light conversion layer 100. Moreover, the three semiconductor electricity-to-light conversion structures 10 are connected in series by connecting the first contact layer 101 and the second contact layer 102 in succession. Each electricity-to-light conversion layer 100 is used for converting the input DC electricity into the light, thus emitting the working light in a required wavelength range. The working light comprises one or more wave bands in a whole spectral range ranging from an ultraviolet light of 100 nm to an infrared light of 100 μm. A single frequency light, such as a red light of 620 nm, a blue light of 460 nm or a violet light of 380 nm, is preferred to fabricate the electricity-to-light conversion layer by a mature prior art. For example, a structure and a material with high quantum efficiency and high electricity-to-light conversion efficiency may be used for forming the electricity-to-light conversion layer 100. Specifically, the structure with high quantum efficiency and high electricity-to-light conversion efficiency may be a LED structure or a laser structure generally including an active layer, a cladding layer, a current spreading layer, a PN junction, etc, in which the active layer may be a multi-quantum well structure. The electricity-to-light conversion layer with the laser structure may further comprise a resonant cavity, and the electricity-to-light conversion layer with the LED structure may further comprise a resonant cavity LED structure. A material of each electricity-to-light conversion layer 100 may be selected based on material characteristics (such as defect density, or energy band structure) and required light wave characteristics (such as wavelength range). For example, the material of each electricity-to-light conversion layer 100 comprises any one of AlGaInP in a red-to-yellow wavelength range; GaN and InGaN in an ultraviolet wavelength range; InGaN, AlGaInN, and ZnO in a blue-to-violet wavelength range; AlGaInAs, GaAS, InGaAs, InGaAsP, AlGaAs, and InGaAsNSb in a red wavelength range or an infrared wavelength range; other group III nitride compounds, group III arsenide compounds or phosphide compounds; and a combination thereof, in which the material with low defect density and high light conversion efficiency (such as AlGaInP, InGaN, or GaN) is preferred. Because each first contact layer 101 is not required to be transparent to the working light, each first contact layer 101 may be a single layer and/or a multi-layer composite structure formed by a metal, an alloy, a conductive oxide, a heavily doped semiconductor, etc., in which a low resistance metal such as Cu is preferred. More preferably, a thickness of a metal electrode layer may be increased to reduce the resistance and be favorable for heat dissipation. Because each second contact layer 102 is transparent to the working light emitted by each electricity-to-light conversion layer 100, a bandgap of a material of each second contact layer 102 should be larger than the photon energy of the working light emitted by each electricity-to-light conversion layer 100 so as to prevent each second contact layer 102 from absorbing the working light, thus improving the light wave conversion efficiency. Generally, the material of each second contact layer 102 may be any one of a heavily doped and wide bandgap semiconductor material, for example, GaAs, GaN, AlGaInP, AlGaInN, or AlGaInAs which is transparent to the working light; a conductive transparent metal oxide, for example, ITO, $SnO_2$, or ZnO; graphene; and a combination thereof.

The six semiconductor light-to-electricity conversion structures 20 connected in series are used for receiving the working light and outputting the electric energy via a lead wire O1 and a lead wire O2. In the vertical direction, each semiconductor light-to-electricity conversion structure 20 comprises an light-to-electricity conversion layer 200 for converting energy, a third contact layer 201 located on a top of each light-to-electricity conversion layer 200, and a fourth contact layer 202 located on a bottom of each light-to-electricity conversion layer 200. Each fourth contact layer 202 is transparent to the working light emitted by the electricity-to-light conversion layer 100. Moreover, the six semiconductor light-to-electricity conversion structures 20 are connected in series by connecting the third contact layer 201 and the fourth contact layer 202 in succession. Each light-to-electricity conversion layer 200 is used for converting the light into the electricity to realize the transformation. A material of each light-to-electricity conversion layer 200 comprises any one of Si, Ge, SiGe, AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials, and a combination thereof It should be noted that an energy band structure of each electricity-to-light conversion layer 100 should be matched with that of each light-to-electricity conversion layer 200, so as to allow the wave band of the working light emitted by each electricity-to-light conversion layer 100 to be matched with a wave band with a maximum absorption efficiency of each light-to-electricity conversion layer 200, to achieve a maximum light wave energy conversion efficiency. Because each third contact layer 201 is not required to be transparent to the working light, each third contact layer 201 may be a single layer and/or a multi-layer composite structure formed by a metal, an alloy, a conductive oxide, a heavily doped semiconductor, etc., in which a low resistance metal such as Cu is preferred. More preferably, a thickness of a metal electrode layer may be increased to reduce the resistance and be favorable for heat dissipation. Because each fourth contact layer 202 is transparent to the working light emitted by each electricity-to-light conversion layer 100, a bandgap of a material of each fourth contact layer 202 should be larger than the photon energy of the working light emitted by each electricity-to-light conversion layer 100 so as to prevent the fourth contact layer 202 from absorbing the working light, thus improving the light wave conversion efficiency. Generally, a material of the fourth contact layer 202 may be and any one of a heavily doped and wide bandgap semiconductor material, for example, GaAs, GaN, AlGaInP, AlGaInN, or AlGaInAs which is transparent to the working light; a conductive transparent metal oxide, for example, ITO, $SnO_2$, or ZnO; graphene; and a combination thereof.

The isolation layer 300 is used for achieving an electrical isolation between the three semiconductor electricity-to-light conversion structures 10 and the six semiconductor light-to-electricity conversion structures 20 to allow an input voltage and an output voltage not to influence each other. Moreover, the isolation layer 300 is transparent to the working light, to allow a light carrying energy to be transmitted from each semiconductor electricity-to-light conversion structure 10 to each semiconductor light-to-electricity conversion structure 20, thus realizing the energy transmission and eventually realizing a voltage conversion. A thickness of the isolation layer 300 is dependent on the input and output voltages and an insulating requirement. The thicker the isolation layer 300, the better the insulating effect is, the higher the breakdown voltage which the isolation layer 300 may bear is, however, the larger the attenuation to the light is. Therefore, a determining principle of the thickness of the isolation layer 300 is that the thinner the better under the conditions where the insulating requirement is met. According to the above requirement, in this embodiment, a material of the isolation layer 300 may be a solid transparent insulating dielectric, for example, any one of $Al_2O_3$, AlN, $SiO_2$, MgO, $Si_3N_4$, BN, diamond, $LiAlO_2$, $LiGaO_2$, GaAs, SiC, $TiO_2$, $ZrO_2$, $SrTiO_3$, $Ga_2O_3$, ZnS, SiC, $MgAl_2O_4$, $LiNbO_3$, $LiTaO_3$, yttrium aluminium garnet (YAG) crystal, $KNbO_3$, LiF, $MgF_2$, $BaF_2$, $GaF_2$, $LaF_3$, BeO, GaP, GaN, a rare earth oxide (REO), and a combination thereof, and also may be any one of a liquid transparent insulating dielectric such as pure water, for example, $CCl_4$ or $CS_2$; or a gaseous transparent insulating dielectric such as $SF_6$, which is filled in a shell.

In addition, in order to obtain a good light-to-electricity energy conversion efficiency, a total reflection occurring at each interface during a light transmission process from each electricity-to-light conversion layer 100 to each light-to-electricity conversion layer 200 should be avoided. Because the total reflection occurs if and only if a light enters from a material with a larger refractive index to a material with a smaller refractive index, an occurrence of the total reflection may be avoided merely by properly matching the refractive index of each layer of material in a direction of light transmission. In some embodiments, the refractive indices of materials of each second contact layer 102, the isolation layer 300, each fourth contact layer 202 and each light-to-electricity conversion layer 200 may be matched with the refractive index of the material of each electricity-to-light conversion layer 100 to avoid the total reflection occurring at each interface during the light transmission process. Here, so called "match" means satisfying a condition: $n_{each\ electricity-to-light\ conversion\ layer} \leq n_{each\ second\ contact\ layer} \leq n_{the\ insulation\ layer} \leq n_{each\ fourth\ contact\ layer} \leq n_{each\ light-to-electricity\ conversion\ layer}$ (n is a refractive index). In one embodiment, refractive indices of materials of each electricity-to-light conversion layer 100, each second contact layer 102, the isolation layer 300, each fourth contact layer 202 and each light-to-electricity conversion layer 200 are approximate. In one preferred embodiment, the refractive indices of materials of each electricity-to-light conversion layer 100, each second contact layer 102, the isolation layer 300, each fourth contact layer 202 and each light-to-electricity conversion layer 200 are increased sequentially, that is, $n_{each\ electricity-to-light\ conversion\ layer} < n_{each\ second\ contact\ layer} < n_{the\ insulation\ layer} < n_{each\ fourth\ contact\ layer} < n_{each\ light-to-electricity\ conversion\ layer}$ (n is a refractive index).

In addition, different material layers may have roughened surfaces, patterned surfaces or photonic crystal structures so as to reduce the total reflection. In one preferred embodiment, at least one of each electricity-to-light conversion layer 100, each second contact layer 102, the isolation layer 300, each fourth contact layer 202 and each light-to-electricity conversion layer 200 has a roughened surface, a patterned surface or a photonic crystal structure to increase a transmittance of light and decrease the total reflection of light.

In one embodiment, each semiconductor electricity-to-light conversion structure 10 may be a multi-junction structure which may emit a plurality of groups of working lights, and each semiconductor light-to-electricity conversion structure 20 may also be a multi-junction structure which may absorb the plurality of groups of working lights and convert them into the electric energy. Specifically, a light in a specific wave band is generally emitted when the electric energy is converted into the light energy by each semiconductor electricity-to-light conversion structure 10. For example, working lights in red and yellow wave bands are mainly emitted by a LED of an $(Al_xGa_{1-x})In_{1-y}P$ (where $0<x<1$, $0<y<1$) material, a working light in a green or blue wave band is emitted by a LED of an $In_xGa_{1-x}N$ (where $0<x<1$) material, and a working light in an ultraviolet wave band is emitted by a LED of an $Al_xGa_{1-x}N$ or $Al_xGa_yIn_{1-x-y}N$ (where $0<x<1$, $0<y<1$) material. Similarly, a light in a specific wave band is generally absorbed by a specific material of each semiconductor light-to-electricity conversion structure 20. For example, a visible light and an infrared light are obviously absorbed by a Si based photovoltaic cell, and a visible light in a specific wave band is absorbed by a group III-V photovoltaic cell. In order to improve the energy conversion efficiency, both each semiconductor electricity-to-light conversion structure 10 and each semiconductor light-to-electricity conversion structure 20 may be the multi-junction structure, that is, the semiconductor electricity converter may consist of a plurality of multi-junction semiconductor electricity-to-light conversion structures 10 emitting the plurality of groups of working lights and a plurality of multi-junction semiconductor light-to-electricity conversion structures 20 absorbing the plurality of groups of working lights, provided that the plurality of groups of working lights emitted by the plurality of multi-junction semiconductor electricity-to-light conversion structures 10 are matched with the plurality of groups of working lights absorbed by the plurality of multi-junction semiconductor light-to-electricity conversion structures 20. The multi-junction structure may increase the energy conversion efficiency when properly matching the working light spectra.

In one embodiment, the semiconductor electricity converter further comprises a plurality of diodes which are connected with the three semiconductor electricity-to-light conversion structures 10 and the six semiconductor light-to-electricity conversion structures 20 respectively. When a current in a circuit is too large, the plurality of diodes will be broken down firstly, thus protecting each semiconductor electricity-to-light conversion structure 10 and each semiconductor light-to-electricity conversion structure 20.

It should be noted that in the above embodiments, the three semiconductor electricity-to-light conversion structures 10 may be located on the isolation layer 300, while the six semiconductor light-to-electricity conversion structures 20 may be located below the isolation layer 300, however, in other embodiments, the three semiconductor electricity-to-light conversion structures 10 may be located below the isolation layer 300, while the six semiconductor light-to-electricity conversion structures 20 may be located on the isolation layer 300. A change of relative position relationship will not cause a substantial influence on a work of the semiconductor electricity converter.

In order to decrease a light loss and increase the light-to-electricity conversion efficiency, based on the embodiments shown in FIG. 11, the semiconductor electricity converter according to an embodiment of the present disclosure may further comprise a reflection layer located on a top of the electricity-to-light conversion layer and a reflection layer located on a top of the light-to-electricity conversion layer so as to allow the light to be confined in a device without leakage. According to different specific positions of the reflection layers, the semiconductor electricity converter may have a structure shown in FIG. 12 or FIG. 13.

Figure 12:
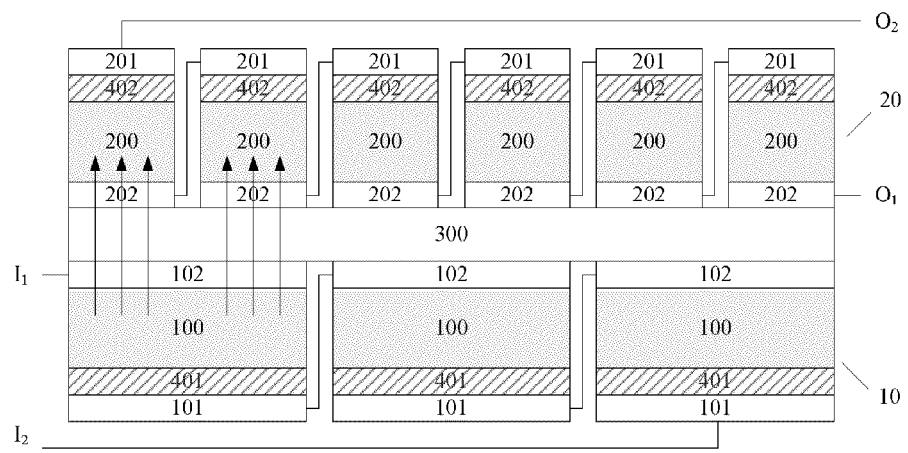
FIG. 12 is a cross-sectional view of a semiconductor electricity converter according to an embodiment of the present disclosure.

FIG. 12 is a cross-sectional view of a semiconductor electricity converter comprising the reflection layers according to an embodiment of the present disclosure. One of the reflection layers is located between each electricity-to-light conversion layer and a top contact layer thereof, and the other is located between each light-to-electricity conversion layer and a top contact layer thereof.

As shown in FIG. 12, compared with the embodiment shown in FIG. 11, a semiconductor electricity converter further comprises: a first reflection layer 401 located between each electricity-to-light conversion layer 100 and each first contact layer 101, and a second reflection layer 402 located between each light-to-electricity conversion layer 200 and each third contact layer 201. The lights may be confined between the first reflection layers 401 and the second reflection layers 402 without leakage, thus increasing a conversion efficiency of each light-to-electricity conversion layer 200. Each first reflection layer 401 and each second reflection layer 402 should have features of conductivity and be energy band matched, because they are located between each first contact layer 101 and each third contact layer 201. Thus, a semiconductor material with a Bragg reflector structure similar to that of each electricity-to-light conversion layer 100 or each light-to-electricity conversion layer 200 may be used to form each first reflection layer 401 or each second reflection layer 402 so as to reflect light. Moreover, because each first contact layer 101 and each third contact layer 201 are not required to be transparent to the working light, each of each first contact layer 101 and each third contact layer 201 may be a single layer and/or a multi-layer composite structure formed by a metal, an alloy, a conductive oxide, a heavily doped semiconductor, etc. to reduce the resistance.

Figure 13:
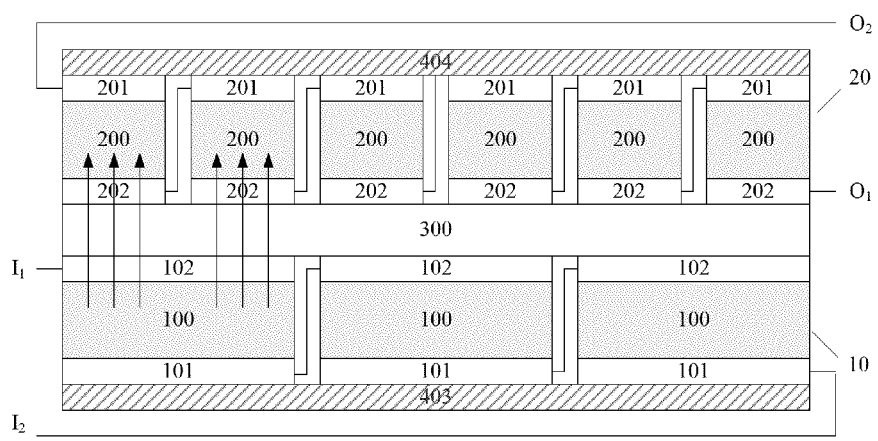
FIG. 13 is a cross-sectional view of a semiconductor electricity converter according to an embodiment of the present disclosure.

FIG. 13 is a cross-sectional view of a semiconductor electricity converter comprising the reflection layers according to an embodiment of the present disclosure. One of the reflection layers is located on tops of the three semiconductor electricity-to-light conversion structures 10, and the other is located on tops of the six semiconductor light-to-electricity conversion structures 20.

As shown in FIG. 13, compared with the embodiment shown in FIG. 11, a semiconductor electricity converter further comprises: a third reflection layer 403 located on the tops of the plurality of semiconductor electricity-to-light conversion structures 10, and a fourth reflection layer 404 located on the tops of the plurality of semiconductor light-to-electricity conversion structures 20. In other words, the third reflection layer 403 is located on the tops of three first contact layers 101, and the fourth reflection layer 404 is located on the tops of six third contact layers 201. The lights may be confined between the third reflection layer 403 and the fourth reflection layer 404 without leakage, thus increasing the conversion efficiency of each light-to-electricity conversion layer 200. If the third reflection layer 403 and the fourth reflection layer 404 are each used as an integral reflection layer, the third reflection layer 403 and the fourth reflection layer 404 need to be insulated, and thus an insulating material such as REO with a Bragg reflector structure may be used to form the third reflection layer 403 or the fourth reflection layer 404. If the third reflection layer 403 and the fourth reflection layer 404 are a plurality of reflection layers distributed on tops of the plurality of structure units, i.e., the three semiconductor electricity-to-light conversion structures 10 and the six semiconductor light-to-electricity conversion structures 20, respectively, a metal, an alloy and other conductive materials with an omnidirectional reflector structure may also be used to form the third reflection layer 403 or the fourth reflection layer 404. Moreover, at this time, because each first contact layer 101 and each third contact layer 201 need to be transparent to the working light, the material of each of each first contact layer 101 and each third contact layer 201 may be any one of a heavily doped and wide bandgap semiconductor material, for example, GaAs, GaN, AlGaInP, AlGaInN, or AlGaInAs; a conductive transparent metal oxide, for example, ITO, $SnO_2$, or ZnO; graphene; and a combination thereof.

Figure 14:
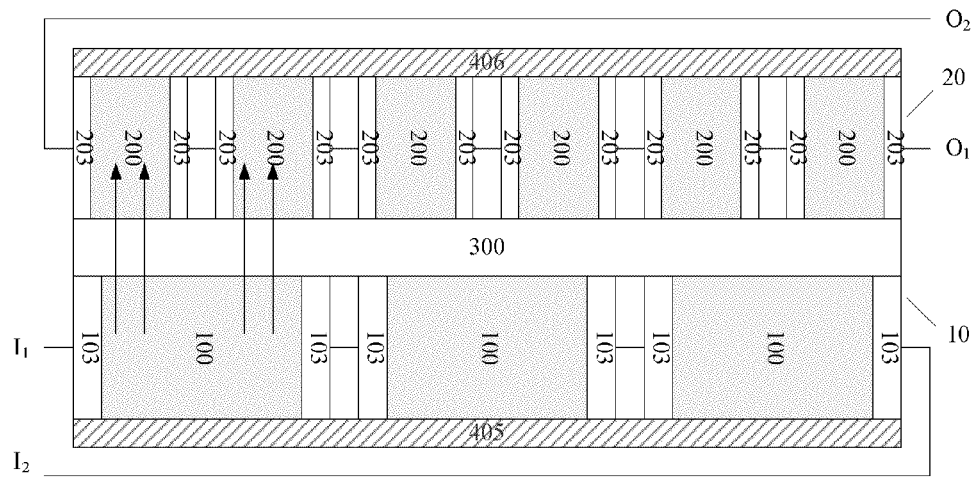
FIG. 14 is a cross-sectional view of a semiconductor electricity converter according to an embodiment of the present disclosure.

In one embodiment, the contact layers of electrodes may also be formed on both sides of each semiconductor electricity-to-light conversion structure 10 and each semiconductor light-to-electricity conversion structure 20 respectively, as shown in FIG. 14.

As shown in FIG. 14, a semiconductor electricity converter comprises: three semiconductor electricity-to-light conversion structures 10 connected in series, six semiconductor light-to-electricity conversion structures 20 connected in series and the insulation layer 300. Each semiconductor electricity-to-light conversion structure 10 comprises the electricity-to-light conversion layer 100 and a fifth contact layer 103 located on each side of each semiconductor electricity-to-light conversion structure 10. Each semiconductor light-to-electricity conversion structure 20 comprises the light-to-electricity conversion layer 200 and a sixth contact layer 203 located on each side of each semiconductor light-to-electricity conversion structure 20. The working light spectrum of the semiconductor electricity-to-light conversion structures 10 is matched with that of the semiconductor light-to-electricity conversion structures 20. The insulation layer 300 is transparent to the working light. In order to obtain a higher energy conversion efficiency, preferably, the semiconductor electricity converter 4 may further comprise: a fifth reflection layer 405 located on the top of each electricity-to-light conversion layer 100 and a sixth reflection layer 406 located on the top of each light-to-electricity conversion layer 200. The fifth reflection layer 405 and the sixth reflection layer 406 need to be insulated, and thus an insulating material such as REO with a Bragg reflector structure may be used to form the fifth reflection layer 405 and the sixth reflection layer 406.

Figure 15:
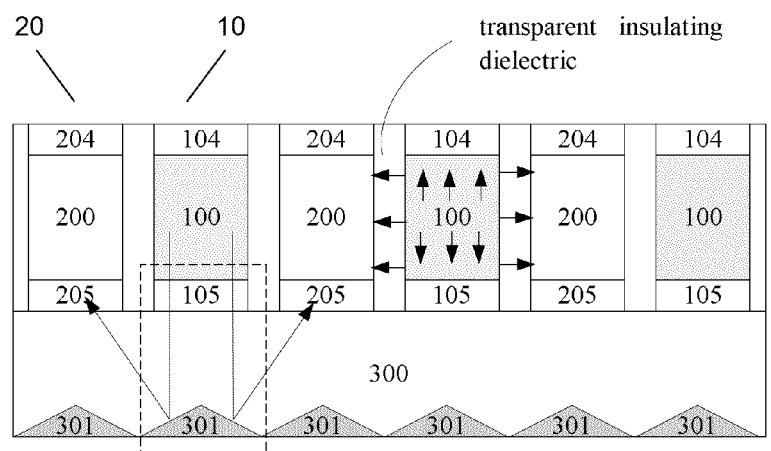
FIG. 15 is a cross-sectional view of a semiconductor electricity converter according to an embodiment of the present disclosure.

In another embodiment, each semiconductor electricity-to-light conversion structure 10 and each semiconductor lightto-electricity conversion structure 20 may be located on a same side of the insulation layer or a substrate layer 300, as shown in FIG. 15.

Figure 16:
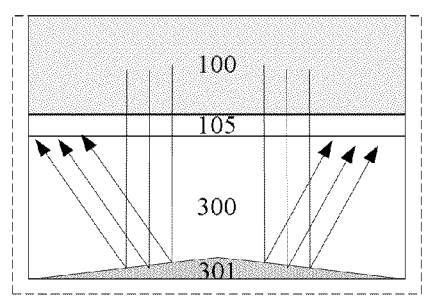
FIG. 16 is a cross-sectional view of an inverted triangular reflector on a top surface of a light-to-electricity conversion layer.

As shown in FIG. 15, a semiconductor electricity converter comprises: three semiconductor electricity-to-light conversion structures 10 connected in series, three semiconductor light-to-electricity conversion structures 20 connected in series and the substrate layer 300. The working light spectrum of the three semiconductor electricity-to-light conversion structures 10 connected in series is matched with that of the three semiconductor light-to-electricity conversion structures 20 connected in series. The three semiconductor electricity-to-light conversion structures 10 and the three semiconductor light-to-electricity conversion structures 20 are arranged alternately on a same surface of the substrate layer 300 (such as a top of the substrate layer 300). An insulating transparent dielectric for electrical isolation is filled between the three semiconductor electricity-to-light conversion structures 10 and the three semiconductor light-to-electricity conversion structures 20. Each semiconductor light-to-electricity conversion structure 10 comprises: the electricity-to-light conversion layer 100, a seventh contact layer 104 located on a top of each electricity-to-light conversion layer 100, and an eighth contact layer 105 located on a bottom of each electricity-to-light conversion layer 100. The eighth contact layer 105 is transparent to the working light. Each semiconductor light-to-electricity conversion structure 20 comprises: the light-to-electricity conversion layer 200, a ninth contact layer 204 located on a top of each light-to-electricity conversion layer 200, and a tenth contact layer 205 located on a bottom of each light-to-electricity conversion layer 200. The tenth contact layer 205 is transparent to the working light. The substrate layer 300 comprises a transparent insulating dielectric layer 310 and a reflection layer 301. A material of the transparent insulating dielectric layer 310 may be a solid transparent insulating material or a liquid or gaseous transparent insulating material enclosed in a shell for providing a space for the light transmission. The reflection layer 301 may be a triangular reflection structure for allowing a longitudinal transmission light emitted by one electricity-to-light conversion layer 100 to be reflected by an inclined plane of the reflection layer 301 to turn to an adjacent light-to-electricity conversion layer 200, as shown in FIG. 16. In one preferred embodiment, the semiconductor electricity converter 5 may further comprise a top reflection layer located on a top of the semiconductor electricity converter 5. Similar to the reflection layer 301, the top reflection layer may have an inverted triangular reflection structure for allowing the transmission direction change of the longitudinal transmission light.

In another embodiment, in addition to emitting light longitudinally as described above, each electricity-to-light conversion layer 100 may also emit light transversely. When each electricity-to-light conversion layer 100 emits light transversely, a simple design is that the plurality of semiconductor electricity-to-light conversion structures 10 and the plurality of semiconductor light-to-electricity conversion structures 20 are arranged alternately on the same surface of the substrate layer 300. In addition, the reflection layers disposed on two opposite surfaces of each electricity-to-light conversion layer 100 and each light-to-electricity conversion layer 200 may confine the light in a certain region to avoid the energy loss caused by the light leakage. According to different specific positions of the reflection layers, the semiconductor electricity converter may have a structure shown in FIG. 17 or FIG. 18.

Figure 17:
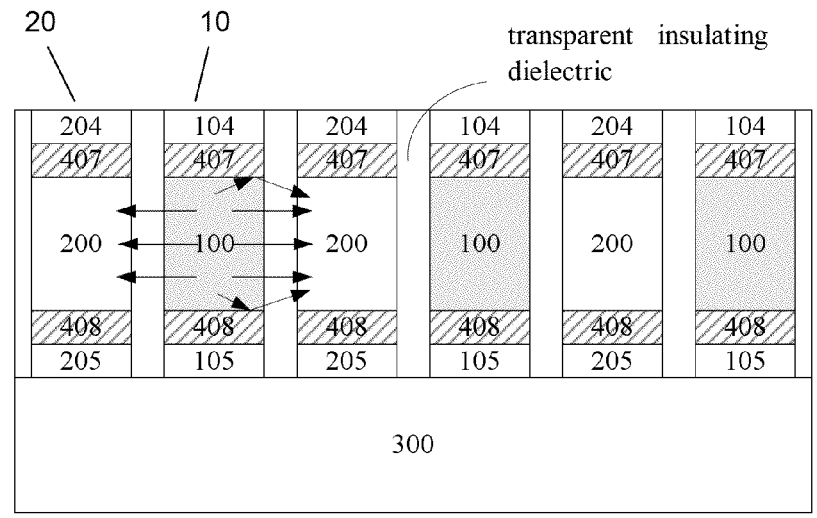
FIG. 17 is a cross-sectional view of a semiconductor electricity converter according to an embodiment of the present disclosure.

FIG. 17 is a cross-sectional view of a semiconductor electricity converter according to an embodiment of the present disclosure.

As shown in FIG. 17, a semiconductor electricity converter comprises: three semiconductor electricity-to-light conversion structures 10 connected in series, three semiconductor light-to-electricity conversion structures 20 connected in series and the substrate layer 300 for supporting. The working light spectrum of the three semiconductor electricity-to-light conversion structures 10 connected in series is matched with that of the three semiconductor light-to-electricity conversion structures 20 connected in series. The three semiconductor electricity-to-light conversion structures 10 and the three semiconductor light-to-electricity conversion structures 20 are arranged alternately on a top surface of the substrate layer 300. The insulating transparent dielectric for electrical isolation is filled between the three semiconductor electricity-to-light conversion structures 10 and the three semiconductor light-to-electricity conversion structures 20. Each semiconductor light-to-electricity conversion structure 10 comprises: the electricity-to-light conversion layer 100, a seventh contact layer 104 located on the top of each electricity-to-light conversion layer 100, and an eighth contact layer 105 located on the bottom of each electricity-to-light conversion layer 100. Each semiconductor light-to-electricity conversion structure 20 comprises: the light-to-electricity conversion layer 200, a ninth contact layer 204 located on the top of each light-to-electricity conversion layer 200, and a tenth contact layer 205 located on the bottom of each light-to-electricity conversion layer 200. The semiconductor electricity converter 6 may further comprise: a seventh reflection layer 407 located between each electricity-to-light conversion layer 100 and the seventh contact layer 104 and between each light-to-electricity conversion layer 200 and the ninth contact layer 204, and an eighth reflection layer 408 located between each electricity-to-light conversion layer 100 and the eighth contact layer 105 and between each light-to-electricity conversion layer 200 and the tenth contact layer 205. The lights may be confined between the seventh reflection layers 407 and the eighth reflection layers 408 without leakage, thus increasing the conversion efficiency of each light-to-electricity conversion layer 200. Each seventh reflection layer 407 and each eighth reflection layer 408 should have features of conductivity and be energy band matched, because they are located between each seventh contact layer 104 and each eighth contact layer 105 and between each ninth contact layer 204 and each tenth contact layer 205. Thus, a semiconductor material with a Bragg reflector structure similar to that of each electricity-to-light conversion layer 100 or each light-to-electricity conversion layer 200 may be used to form each seventh reflection layer 407 and each eighth reflection layer 408 so as to reflect light. Moreover, because each seventh contact layer 104, each eighth contact layer 105, each ninth contact layer 204 and each tenth contact layer 205 are not required to be transparent to the working light, each seventh contact layer 104, each eighth contact layer 105, each ninth contact layer 204 and each tenth contact layer 205 may be a single layer and/or a multi-layer composite structure formed by a metal, an alloy, a conductive oxide, a heavily doped semiconductor, etc. to reduce the resistance.

Figure 18:
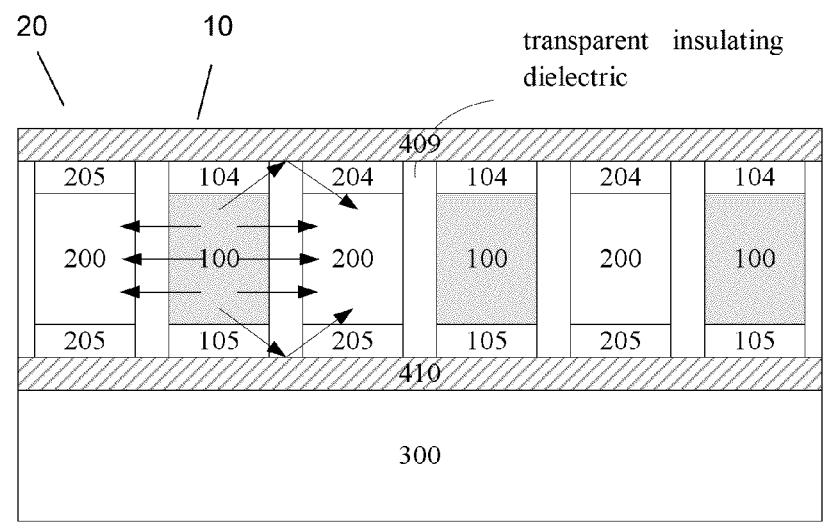
FIG. 18 is a cross-sectional view of a semiconductor electricity converter according to an embodiment of the present disclosure.

FIG. 18 is a cross-sectional view of a semiconductor electricity converter according to an embodiment of the present disclosure.

As shown in FIG. 18, a semiconductor electricity converter comprises: three semiconductor electricity-to-light conversion structures 10 connected in series, three of semiconductor light-to-electricity conversion structures 20 connected in series and the substrate layer 300 for supporting. The working light spectrum of the three semiconductor electricity-to-light conversion structures 10 connected in series is matched with that of the three semiconductor light-to-electricity conversion structures 20 connected in series. The three semiconductor electricity-to-light conversion structures 10 and the three semiconductor light-to-electricity conversion structures 20 are arranged alternately on a top surface of the substrate layer 300. The insulating transparent dielectric for electrical isolation is filled between the three semiconductor electricity-to-light conversion structures 10 and the three semiconductor light-to-electricity conversion structures 20. Each semiconductor electricity-to-light conversion structure 10 comprises: the electricity-to-light conversion layer 100, a seventh contact layer 104 located on the top of each electricity-to-light conversion layer 100, and an eighth contact layer 105 located on the bottom of each electricity-to-light conversion layer 100. Each semiconductor light-to-electricity conversion structure 20 comprises: the light-to-electricity conversion layer 200, a ninth contact layer 204 located on the top of each light-to-electricity conversion layer 200, and a tenth contact layer 205 located on the bottom of each light-to-electricity conversion layer 200. The semiconductor electricity converter 7 may further comprise: a ninth reflection layer 409 located on tops of the seventh contact layer 104 and the ninth contact layer 204, and a tenth reflection layer 410 located on bottoms of the eighth contact layer 105 and the tenth contact layer 410. The lights may be confined between the ninth reflection layer 409 and the tenth reflection layer 410 without leakage, thus increasing the conversion efficiency of each light-to-electricity conversion layer 200. If the ninth reflection layer 409 and the tenth reflection layer 410 are each used as an integral reflection layer, the ninth reflection layer 409 and the tenth reflection layer 410 need to be insulated, and thus an insulating material such as REO with a Bragg reflector structure may be used to form the ninth reflection layer 409 or the tenth reflection layer 410. If the ninth reflection layer 409 and the tenth reflection layer 410 are a plurality of reflection layers distributed on tops of the plurality of structure units, i.e., the three semiconductor electricity-to-light conversion structures 10 and the three semiconductor light-to-electricity conversion structures 20, respectively, a metal, an alloy and other conductive materials with an omnidirectional reflector structure may also be used to form the ninth reflection layer 409 or the tenth reflection layer 410. Moreover, at this time, because each seventh contact layer 104, each eighth contact layer 105, each ninth contact layer 204 and each tenth contact layer 205 need to be transparent to the working light, the material of each of each seventh contact layer 104, each eighth contact layer 105, each ninth contact layer 204 and each tenth contact layer 205 may be any one of a heavily doped and wide bandgap semiconductor material, for example, GaAs, GaN, AlGaInP, AlGaInN, or AlGaInAs; a conductive transparent metal oxide, for example, ITO, $SnO_2$, or ZnO; graphene; and a combination thereof.

Figure 19:
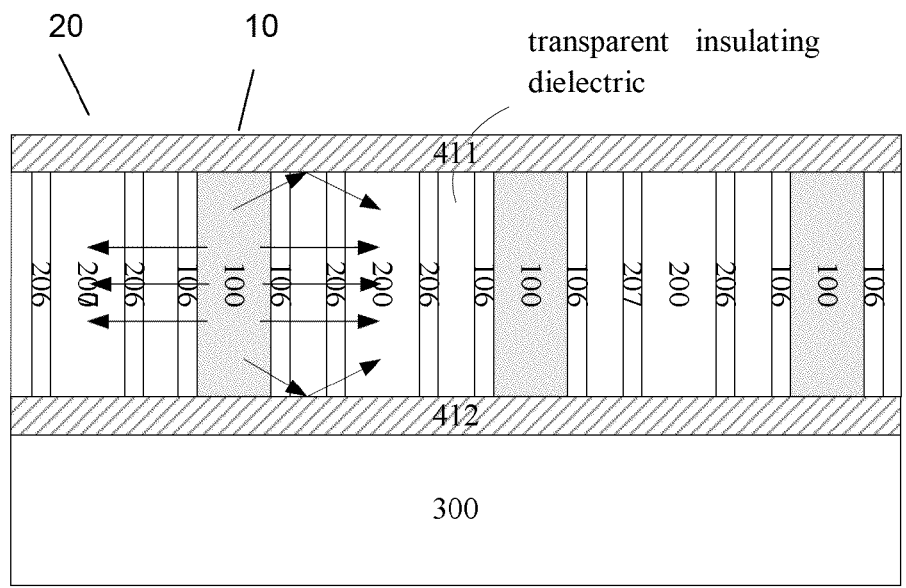
FIG. 19 is a cross-sectional view of a semiconductor electricity converter according to an embodiment of the present disclosure.

FIG. 19 is a cross-sectional view of a semiconductor electricity converter according to an embodiment of the present disclosure.

As shown in FIG. 19, a semiconductor electricity converter comprises: three semiconductor electricity-to-light conversion structures 10 connected in series, three semiconductor light-to-electricity conversion structures 20 connected in series and the substrate layer 300. The working light spectrum of the three semiconductor electricity-to-light conversion structures 10 connected in series is matched with that of the three semiconductor light-to-electricity conversion structures 20 connected in series. The three semiconductor electricity-to-light conversion structures 10 and the three semiconductor light-to-electricity conversion structures 20 are arranged alternately on a top surface of the substrate layer 300. The insulating transparent dielectric for electrical isolation is filled between the plurality of semiconductor electricity-to-light conversion structures 10 and the plurality of semiconductor light-to-electricity conversion structures 20. Each semiconductor light-to-electricity conversion structure 10 comprises: the electricity-to-light conversion layer 100, and an eleventh contact layer 106 formed on each side of each electricity-to-light conversion layer 100. Each semiconductor light-to-electricity conversion structure 20 comprises: the light-to-electricity conversion layer 200, and a twelfth contact layer 206 formed on each side of each light-to-electricity conversion layer 200. The semiconductor electricity converter may further comprise: an eleventh reflection layer 411 located on tops of the electricity-to-light conversion layer 100 and the light-to-electricity conversion layer 200; and a twelfth reflection layer 412 located on bottoms of the electricity-to-light conversion layer 100 and the light-to-electricity conversion layer 200. The lights may be confined between the eleventh reflection layer 411 and the twelfth reflection layer 412 without leakage, thus increasing the conversion efficiency of each light-to-electricity conversion layer 200. The eleventh reflection layer 411 and the twelfth reflection layer 412 need to be insulated, and thus an insulating material such as REO with a Bragg reflector structure may be used to form the eleventh reflection layer 411 or the twelfth reflection layer 412. Moreover, at this time, because each eleventh contact layer 106 and each twelfth contact layer 206 need to be transparent to the working light, the material of each of each eleventh contact layer 106 and each twelfth contact layer 206 may be any one of a heavily doped and wide bandgap semiconductor material, for example, GaAs, GaN, AlGaInP, AlGaInN, or AlGaInAs; a conductive transparent metal oxide, for example, ITO, $SnO_2$, or ZnO; graphene; and a combination thereof.

Figure 20:
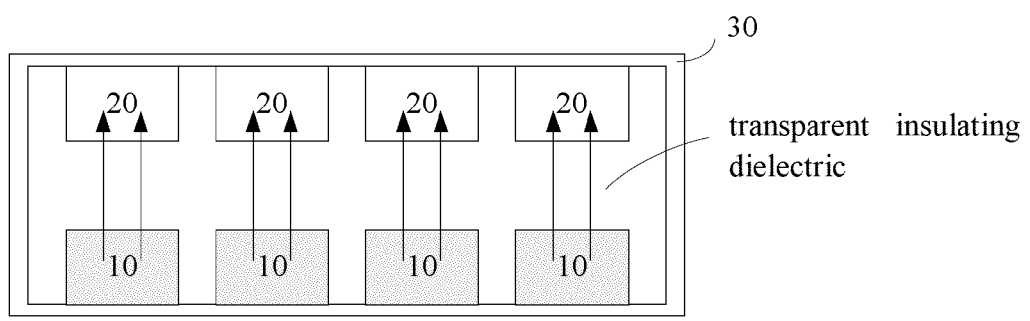
FIG. 20 is a cross-sectional view of a semiconductor electricity converter according to an embodiment of the present disclosure.

FIG. 20 is a cross-sectional view of a semiconductor electricity converter according to an embodiment of the present disclosure.

As shown in FIG. 20, a semiconductor electricity converter comprises: four semiconductor electricity-to-light conversion structures 10 connected in series, four semiconductor light-to-electricity conversion structures 20 connected in series and a shell 30. The working light spectrum of the four semiconductor electricity-to-light conversion structures 10 connected in series is matched with that of the four semiconductor light-to-electricity conversion structures 20 connected in series. The four semiconductor electricity-to-light conversion structures 10 and the four semiconductor light-to-electricity conversion structures 20 are formed on two inner opposite surfaces of the shell 30 respectively, and a liquid transparent insulating dielectric or a gaseous transparent insulating dielectric is filled in the shell 30. A mirror reflector may be set on the inner surface of the shell 30.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:
1. A semiconductor electricity converter, comprising:
   an AC input module configured to convert an input AC electric energy into a light energy, the AC input module comprising a plurality of semiconductor electricity-to-light conversion structures, each semiconductor elec- tricity-to-light conversion structure comprising an electricity-to-light conversion layer; and
an AC output module configured to convert the light energy back into an output AC electric energy, the AC output module comprising a plurality of semiconductor light-to-electricity conversion structures, each semiconductor light-to-electricity conversion structure comprising a light-to-electricity conversion layer;
wherein an emitting spectrum of each semiconductor electricity-to-light conversion structure and an absorption spectrum of each semiconductor light-to-electricity conversion structure are matched with each other.

2. The semiconductor electricity converter according to claim 1, wherein the AC input module comprises:
a first input branch, working in a positive half cycle of an input AC current, the first input branch comprising $M_1$ semiconductor electricity-to-light conversion structures connected in series, where $M_1$ is a positive integer; and
a second input branch, connected with the first input branch in parallel and working in a negative half cycle of the input AC current, the second input branch comprising $M_2$ semiconductor electricity-to-light conversion structures connected in series, where $M_2$ is a positive integer.

3. The semiconductor electricity converter according to claim 2, wherein the AC output module comprises:
a first output branch, a light transmission path formed between the first output branch and the first input branch, the first output branch comprising $N_1$ semiconductor light-to-electricity conversion structures connected in series, where $N_1$ is a positive integer; and
a second output branch, connected with the first output branch in parallel, polarities of the first output branch and the second output branch being opposite, a light transmission path being formed between the second output branch and the second input branch, the second output branch comprising $N_2$ semiconductor light-to-electricity conversion structures connected in series, where $N_2$ is a positive integer.

4. The semiconductor electricity converter according to claim 1, further comprising:
an isolation layer, the plurality of semiconductor electricity-to-light conversion structures located at one side of the isolation layer, the plurality of semiconductor light-to-electricity conversion structures located at the other side of the isolation layer; or
a substrate layer, the plurality of semiconductor electricity-to-light conversion structures and the plurality of semiconductor light-to-electricity conversion structures located at a same side of the substrate layer, the substrate layer having a reflecting structure for reflecting a light emitted by each semiconductor electricity-to-light conversion structure onto one or more semiconductor light-to-electricity conversion structures of the plurality of semiconductor light-to-electricity conversion structures.

5. The semiconductor electricity converter according to claim 4, wherein a material of the isolation layer or the substrate layer is an insulation material, comprising any one of $Al_2O_3$, AlN, $SiO_2$, MgO, $Si_3N_4$, BN, $ZrO_2$, $TiO_2$, diamond, $LiAlO_2$, $LiGaO_2$, semi-insulating GaAs, semi-insulating SiC, semi-insulating GaP, GaN and a combination thereof; or any one of a rare earth oxide and a combination of different rare earth oxides.

6. The semiconductor electricity converter according to claim 4, wherein a material of the isolation layer or the substrate layer is a semiconductor material, comprising any one of GaP, GaAs, InP, GaN, Si, Ge, GaSb, other semiconductor material transparent to the light, and a combination thereof.

7. The semiconductor electricity converter according to claim 6, wherein
an isolation between each semiconductor electricity-to-light conversion structure and the isolation layer and/or an isolation between each semiconductor light-to-electricity conversion structure and the isolation layer is realized by a reverse biased PN junction structure; or
an isolation between each semiconductor electricity-to-light conversion structure and the substrate layer and/or an isolation between each semiconductor light-to-electricity conversion structure and the substrate layer is realized by a reverse biased PN junction structure.

8. The semiconductor electricity converter according to claim 1, further comprising:
a light trap configured to trap a light inside of the semiconductor electricity converter to prevent an energy loss caused by a light leakage.

9. The semiconductor electricity converter according to claim 1, wherein a refractive index of a material of each layer in a light transmission path is matched with each other.

10. A semiconductor electricity converter, comprising:
an AC input module configured to convert an input AC electric energy into a light energy, the AC input module comprising a plurality of semiconductor electricity-to-light conversion structures, each semiconductor electricity-to-light conversion structure comprising an electricity-to-light conversion layer; and
a DC output module configured to convert the light energy into an output DC electric energy, the DC output module comprising one or more semiconductor light-to-electricity conversion structures, each semiconductor light-to-electricity conversion structure comprising a light-to-electricity conversion layer;
wherein an emitting spectrum of each semiconductor electricity-to-light conversion structure and an absorption spectrum of each semiconductor light-to-electricity conversion structure are matched with each other.

11. The semiconductor electricity converter according to claim 10, wherein the AC input module comprises:
a first input branch, working in a positive half cycle of an input AC current, the first input branch comprising $M_1$ semiconductor electricity-to-light conversion structures connected in series, where $M_1$ is a positive integer; and
a second input branch, connected with the first input branch in parallel and working in a negative half cycle of the input AC current, the second input branch comprising $M_2$ semiconductor electricity-to-light conversion structures connected in series, where $M_2$ is a positive integer.

12. The semiconductor electricity converter according to claim 11, wherein the DC output module comprises:
a first output branch, a light transmission path formed between the first output branch and the first input branch, the first output branch comprising $N_1$ semiconductor light-to-electricity conversion structures connected in series, where $N_1$ is a positive integer; and
a second output branch, connected with the first output branch in parallel, polarities of the first output branch and the second output branch being same, a light transmission path being formed between the second output branch and the second input branch, the second output branch comprising $N_2$ semiconductor light-to-electricity conversion structures connected in series, where $N_2$ is a positive integer.

13. The semiconductor electricity converter according to claim 10, further comprising:
an isolation layer, the plurality of semiconductor electricity-to-light conversion structures located at one side of the isolation layer, the one or more semiconductor light-to-electricity conversion structures located at the other side of the isolation layer; or
a substrate layer, the plurality of semiconductor electricity-to-light conversion structures and the one or more semiconductor light-to-electricity conversion structures located at a same side of the substrate layer, the substrate layer having a reflecting structure for reflecting a light emitted by each semiconductor electricity-to-light conversion structure onto a part or all of the one or more semiconductor light-to-electricity conversion structures.

14. The semiconductor electricity converter according to claim 13, wherein a material of the isolation layer or the substrate layer is an insulation material, comprising any one of $Al_2O_3$, AlN, $SiO_2$, MgO, $Si_3N_4$, BN, diamond, $LiAlO_2$, $LiGaO_2$, semi-insulated GaAs, semi-insulated SiC, semi-insulated GaP, GaN and a combination thereof; or any one of a rare earth oxide and a combination of different rare earth oxides.

15. The semiconductor electricity converter according to claim 13, wherein a material of the isolation layer or the substrate layer is a semiconductor material, comprising any one of GaP, GaAs, InP, GaN, Si, Ge, GaSb, other semiconductor material transparent to the light, and a combination thereof.

16. The semiconductor electricity converter according to claim 15, wherein
an isolation between each semiconductor electricity-to-light conversion structure and the isolation layer and/or an isolation between each semiconductor light-to-electricity conversion structure and the isolation layer is realized by a reverse biased PN junction structure; or
an isolation between each semiconductor electricity-to-light conversion structure and the substrate layer and/or an isolation between each semiconductor light-to-electricity conversion structure and the substrate layer is realized by a reverse biased PN junction structure.

17. The semiconductor electricity converter according to claim 10, further comprising:
a light trap configured to trap a light inside of the semiconductor electricity converter to prevent an energy loss caused by a light leakage.

18. The semiconductor electricity converter according to claim 10, wherein a refractive index of a material of each layer in a light transmission path is matched with each other.

19. A semiconductor electricity converter, comprising:
a DC input module configured to convert an input DC electric energy into a light energy, the DC input module comprising a plurality of semiconductor electricity-to-light conversion structures, each semiconductor electricity-to-light conversion structure comprising an electricity-to-light conversion layer; and
an AC output module configured to convert the light energy into an output AC electric energy, the AC output module comprising a plurality of semiconductor light-to-electricity conversion structures, each semiconductor light-to-electricity conversion structure comprising a light-to-electricity conversion layer;
wherein an emitting spectrum of each semiconductor electricity-to-light conversion structure and an absorption spectrum of each semiconductor light-to-electricity conversion structure are matched with each other.

20. The semiconductor electricity converter according to claim 19, wherein the DC input module comprises:
a first input branch, comprising $M_1$ semiconductor electricity-to-light conversion structures connected in series and a first control switch, the first control switch switching the first input branch on in a positive half cycle of an output AC current, where $M_1$ is a positive integer; and
a second input branch, connected with the first input branch in parallel and comprising $M_2$ semiconductor electricity-to-light conversion structures connected in series and a second control switch, the second control switch switching the second input branch on in a negative half cycle of the output AC current, where $M_2$ is a positive integer.

21. The semiconductor electricity converter according to claim 20, wherein the AC output module comprises:
a first output branch, a light transmission path formed between the first output branch and the first input branch, the first output branch comprising $N_1$ semiconductor light-to-electricity conversion structures connected in series, where $N_1$ is a positive integer; and
a second output branch, connected with the first output branch in parallel, polarities of the first output branch and the second output branch being opposite, a light transmission path being formed between the second output branch and the second input branch, the second output branch comprising $N_2$ semiconductor light-to-electricity conversion structures connected in series, where $N_2$ is a positive integer.

22. The semiconductor electricity converter according to claim 19, further comprising:
an isolation layer, the plurality of semiconductor electricity-to-light conversion structures located at one side of the isolation layer, the plurality of semiconductor light-to-electricity conversion structures located at the other side of the isolation layer; or
a substrate layer, the plurality of semiconductor electricity-to-light conversion structures and the plurality of semiconductor light-to-electricity conversion structures located at a same side of the substrate layer, the substrate layer having a reflecting structure for reflecting a light emitted by each semiconductor electricity-to-light conversion structure onto one or more semiconductor light-to-electricity conversion structures of the plurality of semiconductor light-to-electricity conversion structures.

23. The semiconductor electricity converter according to claim 22, wherein a material of the isolation layer or the substrate layer is an insulation material, comprising any one of $Al_2O_3$, AlN, $SiO_2$, MgO, $Si_3N_4$, BN, diamond, $LiAlO_2$, $LiGaO_2$, semi-insulated GaAs, semi-insulated SiC, semi-insulated GaP, GaN and a combination thereof; or any one of a rare earth oxide and a combination of different rare earth oxides.

24. The semiconductor electricity converter according to claim 22, wherein a material of the isolation layer or the substrate layer is a semiconductor material, comprising any one of GaP, GaAs, InP, GaN, Si, Ge, GaSb, other semiconductor material transparent to the light, and a combination thereof.

25. The semiconductor electricity converter according to claim 24, wherein
an isolation between each semiconductor electricity-to-light conversion structure and the isolation layer and/or an isolation between each semiconductor light-to-electricity conversion structure and the isolation layer is realized by a reverse biased PN junction structure; or an isolation between each semiconductor electricity-to-light conversion structure and the substrate layer and/or an isolation between each semiconductor light-to-electricity conversion structure and the substrate layer is realized by a reverse biased PN junction structure.

26. The semiconductor electricity converter according to claim 19, further comprising:
a light trap configured to trap a light inside of the semiconductor electricity converter to prevent an energy loss caused by a light leakage.

27. The semiconductor electricity converter according to claim 19, wherein a refractive index of a material of each layer in a light transmission path is matched with each other.

28. A semiconductor electricity converter, comprising:
a DC input module configured to convert an input DC electric energy into a light energy, the DC input module comprising one or more semiconductor electricity-to-light conversion structures, each semiconductor electricity-to-light conversion structure comprising an electricity-to-light conversion layer; and
a DC output module configured to convert the light energy back into an output DC electric energy, the DC output module comprising one or more semiconductor light-to-electricity conversion structures, each semiconductor light-to-electricity conversion structure comprising a light-to-electricity conversion layer;
wherein an emitting spectrum of each semiconductor electricity-to-light conversion structure and an absorption spectrum of each semiconductor light-to-electricity conversion structure are matched with each other.

29. The semiconductor electricity converter according to claim 28, wherein a material of the electricity-to-light conversion layer comprises any one of AlGaInP, GaN, InGaN, InGaN, AlGaInN, ZnO, AlGaInAs, GaAs, InGaAs, InGaAsP, AlGaAs, AlGaInSb, InGaAsNSb, other groups III-V and II-VI semiconductor materials and a combination thereof, organic light emitting materials and quantum dot light emitting materials.

30. The semiconductor electricity converter according to claim 28, wherein a material of the light-to-electricity conversion layer comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials.

31. The semiconductor electricity converter according to claim 28, further comprising:
an isolation layer, the one or more semiconductor electricity-to-light conversion structures located at one side of the isolation layer, the one or more semiconductor light-to-electricity conversion structures located at the other side of the isolation layer; or
a substrate layer, the one or more semiconductor electricity-to-light conversion structures and the one or more semiconductor light-to-electricity conversion structures located at a same side of the substrate layer, the substrate layer having a reflecting structure for reflecting a light emitted by each semiconductor electricity-to-light conversion structure onto a part or all of the one or more semiconductor light-to-electricity conversion structures.

32. The semiconductor electricity converter according to claim 31, wherein a material of the isolation layer or the substrate layer is an insulation material, comprising any one of $Al_2O_3$, AlN, $SiO_2$, MgO, $Si_3N_4$, BN, diamond, $LiAlO_2$, $LiGaO_2$, GaAs, SiC, $TiO_2$, $ZrO_2$, $SrTiO_3$, $Ga_2O_3$, ZnS, SiC, $MgAl_2O_4$, $LiNbO_3$, $LiTaO_3$, YAG crystal, $KNbO_3$, LiF, $MgF_2$, $BaF_2$, $GaF_2$, $LaF_3$, BeO, GaP, GaN and a combination thereof; or any one of a rare earth oxide and a combination of different rare earth oxides.

33. The semiconductor electricity converter according to claim 31, wherein a material of the isolation layer or the substrate layer is a semiconductor material, comprising any one of GaP, GaAs, InP, GaN, Si, Ge, GaSb, other semiconductor material transparent to the light, and a combination thereof.

34. The semiconductor electricity converter according to claim 33, wherein
an isolation between each semiconductor electricity-to-light conversion structure and the isolation layer and/or an isolation between each semiconductor light-to-electricity conversion structure and the isolation layer is realized by a reverse biased PN junction structure; or
an isolation between each semiconductor electricity-to-light conversion structure and the substrate layer and/or an isolation between each semiconductor light-to-electricity conversion structure and the substrate layer is realized by a reverse biased PN junction structure.

35. The semiconductor electricity converter according to claim 28, further comprising:
a light trap configured to trap a light inside of the semiconductor electricity converter to prevent an energy loss caused by a light leakage.

36. The semiconductor electricity converter according to claim 28, wherein a refractive index of a material of each layer in a light transmission path is matched with each other.

* * * * *